US007129512B2

(12) United States Patent
Shigihara

(10) Patent No.: US 7,129,512 B2
(45) Date of Patent: Oct. 31, 2006

(54) SEMICONDUCTOR LASER DEVICE

(75) Inventor: Kimio Shigihara, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 114 days.

(21) Appl. No.: 10/961,233

(22) Filed: Oct. 12, 2004

(65) Prior Publication Data

US 2005/0121682 A1 Jun. 9, 2005

(30) Foreign Application Priority Data

Dec. 5, 2003 (JP) ............................ 2003-407403

(51) Int. Cl.
*H01L 29/06* (2006.01)

(52) U.S. Cl. .................... 257/9; 257/98; 257/E29.092; 372/75; 372/43.01; 372/50.1

(58) Field of Classification Search .................... None
See application file for complete search history.

(56) References Cited

U.S. PATENT DOCUMENTS 5,568,499 A * 10/1996 Lear ........................ 372/45.01

FOREIGN PATENT DOCUMENTS

JP 7-38193 2/1995
JP 7-170017 7/1995
JP 11-233883 8/1999

OTHER PUBLICATIONS

M. A. Afromowitz, "Thermal conductivity of $Ga_{1-x}Al_xAs$ alloys", J. Appl. Phys. vol. 44, No. 3, Mar. 1973, pp. 1292-1294.
H. C. Casey Jr., et al. "Refractive Index of $Al_xGa_{1-x}As$ between 1.2 and 1.8 eV", Appl. Phys. Lett., vol. 24, No. 2, pp. 63-65, 1974.
W. B. Joyce, et al., "Thermal resistance of heterostructure lasers", J. Appl. Phys., vol. 46, No. 2, pp. 855-862, 1975.
H. Tanaka, et al., "Refractive indices of $In_{0.49}Ga_{0.51-x}Al_xP$ lattice matched to GaAs", J. Appl. Phys., vol. 59, No. 3, pp. 985-986, 1986.
H. Fujii, et al. "Effect pf thermal resistivity on the catastrophic optical damage power density og AlGalnP laser diodes", Appl. Phys. Lett, vol. 62, No. 17, pp. 2114-2115, 1993.

* cited by examiner

*Primary Examiner*—Nathan J. Flynn
*Assistant Examiner*—Scott R. Wilson
(74) *Attorney, Agent, or Firm*—McDermott Will & Emery LLP

(57) ABSTRACT

The present invention provides a semiconductor laser device including a heat sink having one main surface, an n-AlGaAs cladding layer disposed on the main surface of the heat sink, an AlGaAs active layer disposed on the n-AlGaAs cladding layer and a p-AlGaAs cladding layer disposed on the AlGaAs active layer. An effective refractive index and a thermal resistance between a main surface on the heat sink side, of the AlGaAs active layer and a main surface on the heat sink side, of the n-AlGaAs cladding layer are respectively set smaller than those between a main surface on the side opposite to the heat sink, of the AlGaAs active layer and a main surface on the side opposite to the heat sink, of the p-AlGaAs cladding layer.

5 Claims, 8 Drawing Sheets

40
42
26
26
38
36
34
32
30
22
28
44
46
24

SEMICONDUCTOR LASER DEVICE

BACKGROUND OF THE INVENTION

1. Field of the Invention

The present invention relates to a semiconductor laser device, and particularly to a semiconductor laser device which is equipped with a radiating body and performs a high-power operation.

2. Description of the Related Art

There has been a demand for a high-power operation in a semiconductor laser device used as a light source for optical information processing, a signal source for optical communication, or a light source for excitation of a fiber amplifier. Even as a solid-state laser used to weld or cut a metal, e.g., an exciting light source for a YAG laser, the semiconductor laser device needs to have a high-power operation. An improvement in kink level and a reduction in aspect ratio are essential to such a high-power operation.

As a well-known example of a conventional semiconductor laser device, there has been shown a configuration wherein a refractive index distribution as viewed in the thickness direction is made asymmetric as viewed from an active layer in a semiconductor laser having a ridge waveguide to thereby prevent the occurrence of high-order modes responsible for kink occurrence, thus enabling a high-speed operation, and a light intensity distribution of light waveguided by making a refractive index of a lower cladding layer greater than that of an upper cladding layer is shifted to the substrate side upon the upper and lower portions of the active layer to distribute lots of light to the lower cladding layer, thus resulting in a reduction in aspect ratio (see, for example, Japanese Patent Laid-Open No. Hei 11(1999)-233883, paragraph number [0017] and FIG. 2).

Further, as a well-known example of another semiconductor laser device, there has been disclosed a configuration wherein a high refractive index guide layer is provided on a cladding layer on the reacting body side to thereby pull a light distribution to the cladding layer on the radiating body side on the whole, whereby an optical density in the vicinity of an active layer is reduced, a COD (Catastrophic Optical Damage) level is enhanced and high powering is made (see, for example, Japanese Patent Laid-Open No. Hei 7(1995)-38193, paragraph number [0014] and FIG. 1).

Furthermore, as a well-known example of a further semiconductor laser device, there has been disclosed a configuration wherein at least one of cladding layers provided in contact with an active layer of a quaternary semiconductor laser such as AlGaInP that performs short-wavelength oscillations is constituted of a quaternary cladding layer of a superlattice structure based on periodic laminating of thin-film semiconductors of ternary mixed crystals such as AlInP and GaInP, whereby the dimension of each mixed crystal is lowered to reduce scattering due to disordering in the mixed crystals and enhance thermal conductivity (see, for example, Japanese Patent Laid-Open No. Hei 7(1995)-170017, paragraph numbers [0011] through [0013] and FIG. 1).

However, a semiconductor laser device with a high-power operation encounters an important problem of how to effectively conduct heat generated in a laser chip to a radiator or radiating body. Therefore, a thermal conductivity distribution of materials constituting a semiconductor laser for conducting the generated heat to the radiating body, as well as a mere improvement in kink level and reduction in aspect ratio become an important problem.

On the other hand, in a compound semiconductor used in the semiconductor laser, its composition is closely related to a refractive index and also even to thermal conductivity.

According to M. A. Afromowitz, "Thermal conductivity of $Ga_{1-x}Al_xAs$ alloys", J. Appl. Phys., Vol. 44, NO. 3, March 1973, pp. 1292–1294, the thermal conductivity becomes lower as an Al composition ratio approximates 0.5 in the case of AlGaAs. Therefore, according to how to take or determine refractive indices of a cladding layer disposed on the radiating body side and a cladding layer disposed on the non-radiating body side, this might be a configuration disadvantageous to the transfer of heat to the radiating body.

SUMMARY OF THE INVENTION

The present invention has been made to solve the foregoing problems. A first object of the present invention is to provide a semiconductor laser device which reduces the angle of expansion of a vertical beam to lessen end-face degradation at a high-power operation and improves the transfer of heat to a radiating body to thereby enhance reliability at the high-power operation.

According to one aspect of the invention, there is provided a semiconductor laser device comprising: a radiating body having one main surface; a first conductivity type first semiconductor layer of a first conductivity type disposed on the main surface of the radiating body, the first semiconductor layer having a first main surface opposite to the main surface of the radiating body and a second main surface opposite to the first main surface with respect to each other; an active layer disposed on the second main surface of the first semiconductor layer, the active layer having a first main surface opposite to the second main surface of the first semiconductor layer and a second main surface opposite to the first main surface of the active layer with respect to each other; and a second conductivity type second semiconductor layer of a second conductivity type disposed on the second main surface of the active layer, the second semiconductor layer having a first main surface opposite to the second main surface of the active layer and a second main surface opposite to the first main surface of the second semiconductor layer with respect to each other; wherein an effective refractive index between the first main surface of the active layer and the first main surface of the first semiconductor layer is lower than an effective refractive index between the second main surface of the active layer and the second main surface of the second semiconductor layer, and a thermal resistance between the first main surface of the active layer and the first main surface of the first semiconductor layer is smaller than a thermal resistance between the second main surface of the active layer and the second main surface of the second semiconductor layer.

Accordingly, in the semiconductor laser device according to the present invention, an effective refractive index of a semiconductor layer lying on the radiating body side with respect to an active layer is set lower than that of a semiconductor layer lying on the non-radiating body side with respect to the active layer to thereby expand a light intensity distribution to the non-radiating body side with respect to the active layer to reduce an aspect ratio, and the angle of expansion of a vertical beam is reduced to ensure a satisfactory high-power operation. Further, a thermal resistance of the semiconductor layer disposed on the radiating body side with respect to the active layer is set smaller than that of the semiconductor layer disposed on the non-radiating body side with respect to the active layer to thereby enable satisfactory transfer of heat to the radiating body side.

Hence, the semiconductor laser device according to the present invention can be configured which enables a high-power operation and makes it easy to transfer heat produced with the high-power operation to a radiator. By extension, a semiconductor laser can be provided whose high-power operation is high in reliability.

According to another aspect of the invention, there is provided a waveguide type device comprising: a semiconductor laser device comprising: a radiating body having one main surface; a first semiconductor layer of a first conductivity type disposed on the main surface of the radiating body; a third semiconductor layer having one or plural layers, which is disposed on the first semiconductor layer; an active layer disposed on the third semiconductor layer; a fourth semiconductor layer having one or plural layers, which is disposed on the active layer; and a second semiconductor layer of a second conductivity type disposed on the fourth semiconductor layer, wherein a thermal resistance determined based on the first semiconductor layer and the third semiconductor layer is smaller than a thermal resistance determined based on the fourth semiconductor layer and the second semiconductor layer, and an effective refractive index determined based on the first semiconductor layer and the third semiconductor layer is lower than an effective refractive index determined based on the fourth semiconductor layer and the second semiconductor layer.

Accordingly, in the semiconductor laser device according to the present invention, an effective refractive index determined based on the first semiconductor layer and the third semiconductor layer is lower than an effective refractive index determined based on the fourth semiconductor layer and the second semiconductor layer to thereby expand a light intensity distribution to the fourth semiconductor layer to reduce an aspect ratio, and the angle of expansion of a vertical beam is reduced to ensure a satisfactory high-power operation. Further, a thermal resistance determined based on the first semiconductor layer and the third semiconductor layer is smaller than a thermal resistance determined based on the fourth semiconductor layer and the second semiconductor layer, to thereby enable satisfactory transfer of heat to the radiating body side.

Hence, the semiconductor laser device according to the present invention can be configured which enables a high-power operation and makes it easy to transfer heat produced with the high-power operation to a radiator. By extension, a semiconductor laser can be provided whose high-power operation is high in reliability.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the substantially same elements are given the same reference numbers.

DESCRIPTION OF THE PREFERRED EMBODIMENTS

First Embodiment

Figure 1:
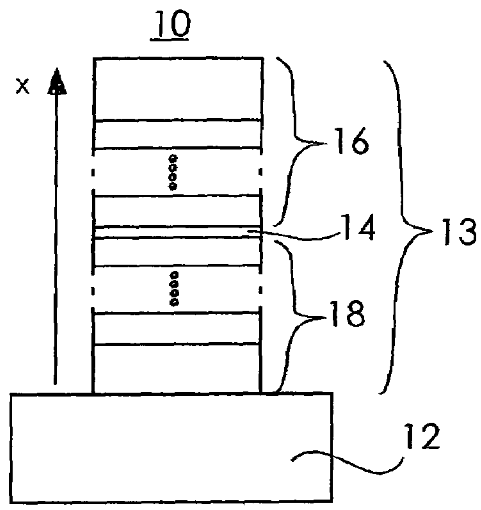
FIG. 1 is a typical diagram of a semiconductor laser device according to one embodiment of the present invention.
Figure 2:
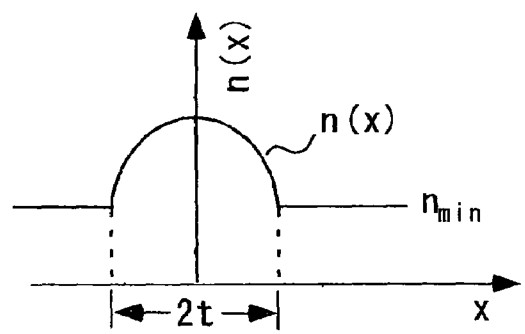
FIG. 2 is a typical diagram showing a refractive index distribution of semiconductor layers of the semiconductor laser device according to the present invention.

FIG. 1 is a typical diagram of a semiconductor laser device according to one embodiment of the present invention. FIG. 2 is a typical diagram showing a refractive index distribution of semiconductor layers of the semiconductor laser device according to the present invention.

The first embodiment will explain a basic configuration containing even embodiments from a second embodiment.

In FIG. 1, the semiconductor laser device 10 comprises a heat sink 12 used as a radiator or radiating body, and a semiconductor laser element 13 disposed on the heat sink 12. The semiconductor laser element 13 is constituted of a semiconductor layer 16 and a semiconductor layer 18 laminated on each other with an active layer 14 interposed therebetween. The semiconductor layer 16 is provided on the side opposite to the heat sink 12 with respect to the active layer 14 and the semiconductor layer 18 is provided on the heat sink 12 side with respect to the active layer 14, respectively.

The semiconductor layer 16 is constituted of a first layer adjacent to the active layer 14 to an nth layer farthest from the heat sink 12. The thickness of the first layer is ta (1), its thermal conductivity is λa(1), its refractive index is na(1), . . . , the thickness of an n−1th layer is ta(n−1), its thermal conductivity is λa(n−1), its refractive index is na(n−1), and the thickness of the nth layer is ta(n), its thermal conductivity is λa(n) and its refractive index is na(n).

Also the semiconductor layer 18 is constituted of a first layer adjacent to the active layer 14 to an mth layer closest to the heat sink 12. The thickness of the first layer is tb(1), its thermal conductivity is λb(1), its refractive index is nb(1), . . . , the thickness of an m−1th layer is tb(m−1), its thermal conductivity is λb(m−1), its refractive index is nb(m−1), and the thickness of the mth layer is tb(m), its thermal conductivity is λb(m) and its refractive index is nb(m).

Incidentally, a main surface of each layer on the radiator side is defined as a first main surface, whereas a main surface opposite to the first main surface with respect to each other, i.e., a main surface thereof on the non-radiator side is defined as a second main surface.

The nth layer of the semiconductor layer 16 is, for example, a p-cladding layer used as a second semiconductor, and the mth layer of the semiconductor layer 18 is, for example, an n-cladding layer used as a first semiconductor layer.

The semiconductor layers 16 and 18 employed in the first embodiment are configured so as to meet the following two conditions (1) and (2):

(1) The thermal conduction of the semiconductor layer 18 is superior to that of the semiconductor layer 16.

(2) An effective refractive index of the semiconductor layer 18 is lower than that of the semiconductor layer 16.

That is, the condition (1) is expressed by the following expression (1) when a thermal resistance is proportional to the thickness of each layer and inversely proportional to its thermal conductivity:

$$ta(1)/\lambda a(1)+ta(2)/\lambda a(2)+ \dots +ta(n-1)/\lambda a(n-1)+ta(n)/\lambda a(n)>tb(1)/\lambda b(1)+tb(2)/\lambda b(2)+ \dots +tb(m-1)/\lambda b(m-1)+tb(m)/\lambda b(m) \quad (1)$$

Also the condition (2) is defined in the following manner. Now, the lowest refractive index in the respective layers is defined as nmin, and a refractive index distribution n(x) of each layer is defined by the refractive index distribution shown in FIG. 2.

In the present embodiment, t is defined as ½ of the thickness of each layer. For instance, t=tb(1)/2, and n(x)=nb (1)in the first layer of the semiconductor layer 18.

Let's assume that the effective refractive index can be made approximate by a normalized frequency V. The normalized frequency V can be made approximate as given by the following expression (2):

$$V = (2\pi/\lambda)[n(x)^2 - n\mathrm{min}^2]^{1/2}t \approx (2\pi/\lambda)[2n\mathrm{min}\times\Delta n]^{1/2}t \quad (2)$$

where Δn=n(x)−nmin, and λ indicates an oscillation wavelength.

Thus, the effective refractive index of each layer is characterized by $[\Delta n]^{1/2}t$. As a result, the condition (2) is given by the following expression (3):

$$[\Delta na(1)]^{1/2}ta(1)+[\Delta na(2)]^{1/2}ta(2)+ \dots +[\Delta na(n-1)]^{1/2}ta(n-1)[\Delta na(n)]^{1/2}ta(n)>[\Delta nb(1)]^{1/2}tb(1)+[\Delta nb(2)]^{1/2}tb(2)+ \dots +[\Delta nb(m-1)]^{1/2}tb(m-1)+[\Delta nb(m)]^{1/2}tb(m) \quad (3)$$

In the semiconductor laser device according to the first embodiment of the present invention as described above, the effective refractive index of the semiconductor layer placed on the radiator side with respect to the active layer, i.e., the effective refractive index between the first main surface of the active layer and the first main surface of the mth layer of the semiconductor layer 18 is set lower than the effective refractive index of the semiconductor layer disposed on the side opposite to the radiator with respect to the active layer, i.e., the effective refractive index between the second main surface of the active layer and the second main surface of the nth layer of the semiconductor layer 16. Therefore, the light intensity distribution of the semiconductor laser is expanded to the semiconductor layer disposed on the side opposite to the radiator with respect to the active layer. That is, an optical density is reduced with the expansion of a beam and end-face degradation at high power or energy becomes hard to occur. Further, a high-power operation is enabled and the angle of expansion of a vertical beam becomes small, thus resulting in a reduction in aspect ratio.

Further, the thermal resistance of the semiconductor layer disposed on the radiator side with respect to the active layer, i.e., the thermal resistance between the first main surface of the active layer and the first main surface of the mth layer of the semiconductor layer 18 becomes lower than the thermal resistance of the semiconductor layer disposed on the side opposite to the radiator with respect to the active layer, i.e., the thermal resistance between the second main surface of the active layer and the second main surface of the nth layer of the semiconductor layer 16. Hence, heat of the semiconductor laser, which is generated in the vicinity of the active layer, is easy to conduct to the radiator.

Thus, a semiconductor laser device can be configured which enables a high-power operation and makes it easy to transfer heat produced with the high-power operation to a radiator. By extension, a semiconductor laser can be provided whose high-power operation is high in reliability.

Incidentally, the second embodiment and its subsequent embodiments are embodiments more specifically configured based on the basic idea of the first embodiment.

Second Embodiment

Figure 3:
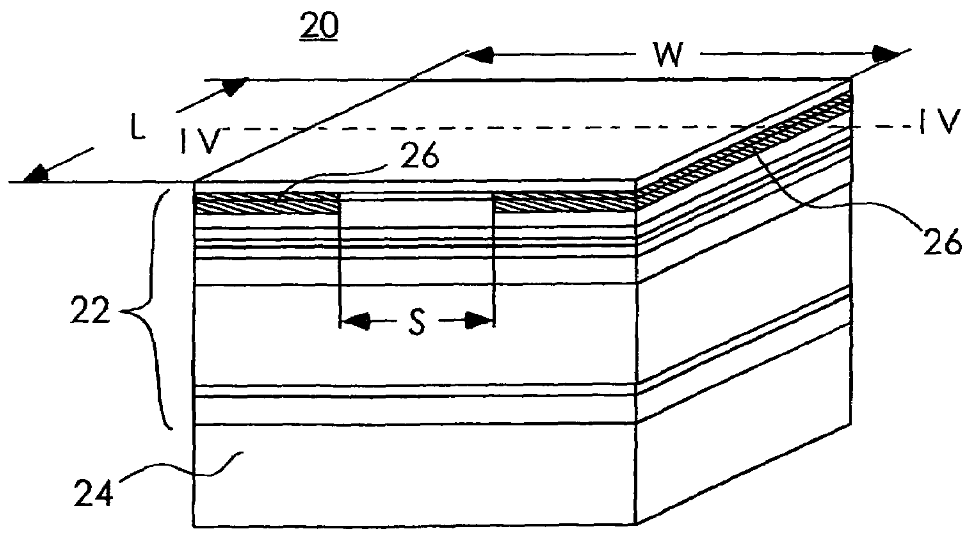
FIG. 3 is a perspective view of a semiconductor laser device according to one embodiment of the present invention.
Figure 4:
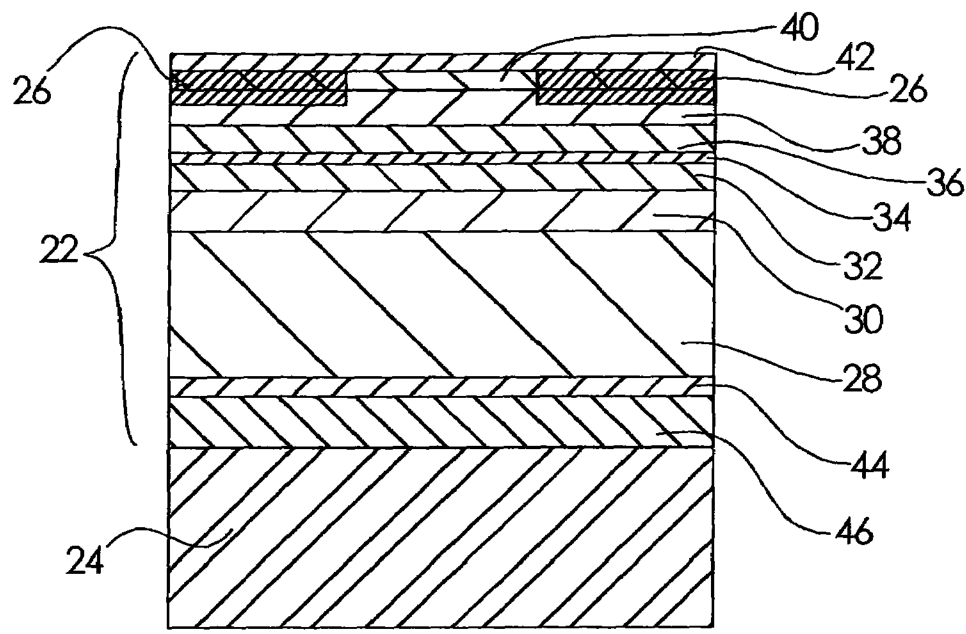
FIG. 4 is a cross-sectional view of the semiconductor laser device as viewed in a cross-section taken along line IV—IV of FIG. 3.

FIG. 3 is a perspective view of a semiconductor laser device according to one embodiment of the present invention. FIG. 4 is a cross-sectional view of the semiconductor laser device as viewed in a cross-section taken along line IV—IV of FIG. 3.

The second through fifth embodiments will explain, as an example, a semiconductor laser device used as an excitation light source of a solid state laser whose oscillation wavelength lies in the neighborhood of 810 nm, e.g., a YAG laser used for metal welding and cutting-off.

In FIG. 3, the semiconductor laser device 20 is formed of a semiconductor laser element 22 and a CuW heat sink 24 used as a radiating body or radiator. Hatched portions are proton injection regions 26 for current restriction. The hatching shown in FIG. 3 does not show a cross-section. A portion pinched between the proton injection regions 26 is a stripe corresponding to a region in which a current flows. The width of the stripe is expressed in S. In the semiconductor laser element 22, a laser resonator length is expressed in L and a laser element width is expressed in W.

In the second embodiment, for example, the laser resonator length L=1000 μm, the laser element width W=200 μm and the stripe width S=60 μm. Also the thickness of the heat sink 24 is 0.3 mm.

In FIG. 4, the semiconductor laser element 22 includes an n-GaAs substrate 28, and an n-AlGaAs cladding layer 30 (its Al composition ratio x=0.90, and its thickness t=1.5 μm) used as a first semiconductor layer, an undoped AlGaAs guide layer 32 (its Al composition ratio x=0.40, and its thickness t=94 nm) used as a third semiconductor layer, an AlGaAs active layer 34 (its Al composition ratio x=0.10, and its thickness t=16 nm), an undoped AlGaAs guide layer 36 (its Al composition ratio x=0.40, and its thickness t=94 nm) used as a fourth semiconductor layer, a p-AlGaAs cladding layer 38 (its Al composition ratio x=0.55, and its thickness t=1.5 μm) used as a second semiconductor layer and a p-GaAs contact layer 40, all of which are sequentially disposed over the surface of the n-GaAs substrate 28 from the n-GaAs substrate 28 side.

The proton injection regions 26 for current restriction are provided on both sides of the stripe corresponding to the region in which the current flows, with the stripe left in the center of the element width. Protons are injected in the direction of depth of each proton injection region 26 so as to range from the surface of the p-GaAs contact layer 40 to the middle of the thickness of the p-AlGaAs cladding layer 38.

Further, a p electrode 42 is provided on the surface of the p-GaAs contact layer 40.

An n electrode 44 is formed on the back side of the n-GaAs substrate 28. A gold-plated layer 46 having a thickness of about 3 μm is disposed on the surface of the n electrode 44. The gold-plated layer 46 and the heat sink 24 are joined to each other by solder.

The present second embodiment is configured in the form of a junction-up (J-UP) assembly wherein the n-GaAs substrate 28 is provided on the heat sink 24 side with respect to the AlGaAs active layer 34.

The operation of the semiconductor laser according to the second embodiment will next be described.

According to H. C. Casey Jr., D. D. Sell, and M. B. Panish, "Refractive index of $Al_xGa_{1-x}As$ between 1.2 and 1.8 eV", Appl. Phys. Lett., Vol. 24, No. 2, 15 Jan. 1974, pp. 63–65, the refractive index of an AlGaAs material monotonously decreases with an increase in Al composition ratio. The refractive index n(x) can be expressed in the following expression (4) with respect to the Al composition ratio x:

$$n(x)=3.590-0.710x+0.91x^2 \quad (4)$$

Since the Al composition ratio of the n-AlGaAs cladding layer 30 in the semiconductor laser device 20 is x=0.90 and the Al composition ratio of the p-AlGaAs cladding layer 38 is x=0.55, the refractive index of the n-AlGaAs cladding layer 30 becomes 3.025 and the refractive index of the p-AlGaAs cladding layer 38 becomes 3.227 by the calculations of their refractive indices from the expression (4).

Thus, the effective refractive indices of the undoped AlGaAs guide layer 36 and p-AlGaAs cladding layer 38 lying on the side opposite to the heat sink 24 with respect to the AlGaAs active layer 34 become higher than the effective refractive indices of the undoped AlGaAs guide layer 32 and n-AlGaAs cladding layer 30 lying on the heat sink 24 side with respect to the AlGaAs active layer 34, considering where the undoped AlGaAs guide layer 32 and undoped AlGaAs guide layer 36 are of structures in which both the refractive index and thickness are symmetric with the AlGaAs active layer 34 interposed therebetween. Therefore, a light intensity distribution extends to the p-AlGaAs cladding layer 38 lying on the side opposite to the heat sink 24.

Therefore, since the angle θv of expansion of a vertical beam becomes small and the angle θh of expansion of a horizontal beam does not change in particular, an aspect ratio corresponding to the ratio of the angle θv to the angle θh becomes small.

Since the relationship of inverse proportion is established between a beam diameter ω of a near field pattern (NFP) and its beam expansion angle, the beam diameter of the near field pattern expands as the angle θv of expansion of the vertical beam becomes small, and the optical density is reduced. Therefore, end-face degradation at high power is lessened and hence the reliability of a laser diode (hereinafter called "LD") at a high-power operation can be enhanced.

Furthermore, when the light intensity distribution extends to the p-AlGaAs cladding layer 38 placed on the side opposite to the heat sink 24, the absorption of free carriers caused by the n-AlGaAs cladding layer 30 is reduced so that optical absorption is reduced, thereby making it possible to improve slope efficiency and perform a high-power operation.

On the other hand, according to the previously-mentioned Afromowitz paper, it shows that the thermal resistivity monotonously increases to near 0.5 as the Al composition ratio increases from 0, and the thermal resistivity monotonously decreases as the Al composition ratio further increases from near 0.5.

It is understood that since the Al composition ratio of the n-AlGaAs cladding layer 30 lying on the heat sink 24 side with respect to the AlGaAs active layer 34 is x=0.90, and the Al composition ratio of the p-AlGaAs cladding layer 38 lying on the side opposite to the heat sink 24 with respect to the AlGaAs active layer 34 is x=0.55 in the semiconductor laser device 20, the thermal conductivity of the n-AlGaAs cladding layer 30 is higher than that of the p-AlGaAs cladding layer 38.

According to W. B. Joice and R. W. Dixon, "Thermal resistance of heterostructure lasers", J. Appl. Phys., Vol. 46, No. 2, February 1975, pp. 855–862, the thermal resistance of the semiconductor laser can be calculated.

Calculating the thermal resistance of the semiconductor laser device 20, based on it results in 21.54° C./W.

For comparison, the Al composition ratio of the n-AlGaAs cladding layer lying on the heat sink 24 side is set to x=0.55 identical to the Al composition ratio of the p-AlGaAs cladding layer 38, the thickness thereof is of course set identical to the thickness t=1.5 μm of the n-AlGaAs cladding layer 30, and other specs are set identical to the semiconductor laser device 20. Then, the thermal resistance is calculated in this condition. Consequently, the thermal resistance of a comparative example 1 having such a symmetric refractive index structure results in 21.90° C./W.

Thus, the semiconductor laser device 20 according to the present embodiment is capable of achieving a 1.6% reduction in thermal resistance as compared with the comparative example 1 in which the p-AlGaAs cladding layer and the n-AlGaAs cladding layer are set identical to each other in Al composition ratio.

Modification 1

Figure 5:
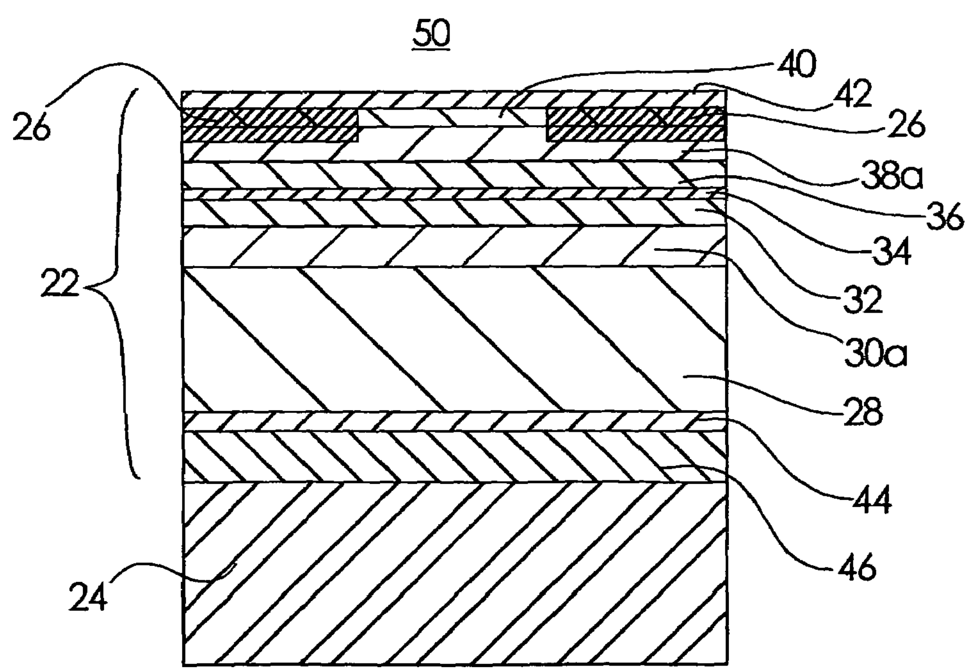
FIG. 5 is a cross-sectional view of a modification of the semiconductor laser device according to one embodiment of the present invention.

FIG. 5 is a cross-sectional view of a modification of the semiconductor laser device according to one embodiment of the present invention. Since FIG. 5 is also basically identical in configuration to FIG. 2, the position of a section of FIG. 5 also corresponds to the section taken along line IV—IV of FIG. 3. Incidentally, the same reference numerals in the respective drawings indicate the same or equivalent ones.

The semiconductor laser device 50 shown in FIG. 5 is different from the semiconductor laser device 20 in that an n-AlGaAs cladding layer 30*a* is configured with its Al composition ratio as x=0.90 and its thickness as t=0.4 μm, and a p-AlGaAs cladding layer 38*a* is configured with its Al composition ratio as x=0.55 and its thickness as t=2.0 μm. The semiconductor laser device 50 is identical in other configuration to the semiconductor laser device 20.

Even in the case of the semiconductor laser device 50 as well as in the case of the semiconductor laser device 20, the refractive indices of the p-AlGaAs cladding layer 38 and p-AlGaAs cladding layer 38*a* each lying on the side opposite to the heat sink 24 with respect to the AlGaAs active layer 34 become higher than those of the n-AlGaAs cladding layer 30 and n-AlGaAs cladding layer 30*a* each lying on the heat sink 24 side with respect to the AlGaAs active layer 34. Therefore, a light intensity distribution extends to the p-AlGaAs cladding layer 38 and p-AlGaAs cladding layer 38*a* each lying on the side opposite to the heat sink 24.

Therefore, even if the thickness of the n-AlGaAs cladding layer lying on the heat sink 24 side with respect to the AlGaAs active layer 34 becomes slightly thin, the optical influence of the n-GaAs substrate 28 is not exerted. Thus, in the semiconductor laser device 50, the n-AlGaAs cladding layer 30*a* is set with the Al composition ratio held as x=0.90 as it is and its thickness as t=0.4 μm.

The p-AlGaAs cladding layer 38*a* to which the light intensity distribution extends, holds the Al composition ratio as x=0.55 as it is, and sets its thickness thick as t=2.0 μm to lessen the optical influence of the p-GaAs contact layer 40.

In the semiconductor laser device 50 in a manner similar to the semiconductor laser device 20, the thermal conductivity of the n-AlGaAs cladding layer 30*a* is higher than that of the p-AlGaAs cladding layer 38*a*. Further, in the semiconductor laser device 50, the thickness of the n-AlGaAs cladding layer 30*a* is thinner than that of the n-AlGaAs cladding layer 30 of the semiconductor laser device 20, and the distance from the AlGaAs active layer 34 to the heat sink 24 is short. Therefore, thermal conduction to the heat sink becomes easy and hence a radiating effect can be enhanced.

The thermal resistance of the semiconductor laser device 50 results in about 21.11° C./W and is brought to about 3.6% reduction as compared with the thermal resistance of the comparative example 1. Thus, the thermal resistance thereof is brought to about 2.0% reduction as compared with the thermal resistance of the semiconductor laser device 20.

In the semiconductor laser device according to the present embodiment as described above, the thermal conduction of the n-AlGaAs cladding layer disposed on the radiator side with respect to the AlGaAs active layer is made better than that of the p-AlGaAs cladding layer disposed on the side opposite to the radiator with respect to the AlGaAs active layer, thereby making it easy to transfer the generated heat of the semiconductor laser to the radiator and allowing the refractive index of the n-AlGaAs cladding layer disposed on the radiator side with respect to the AlGaAs active layer to be lower than that of the p-AlGaAs cladding layer disposed on the side opposite to the radiator with respect to the AlGaAs active layer. Therefore, the light intensity distribution of the semiconductor laser extends to the p-AlGaAs cladding layer disposed on the side opposite to the radiator and thereby the aspect ratio becomes small. Further, the diameter of a beam is enlarged so that an optical density is reduced, thereby making it hard to cause end-face degradation at high power and enabling a high-power operation.

Further, the absorption of free carriers caused by the n-AlGaAs cladding layer is reduced so that optical absorption is reduced, thereby making it possible to improve slope efficiency and carry out a high-power operation.

Since the light intensity distribution extends to the p-AlGaAs cladding layer lying on the side opposite to the radiator, the thickness of the n-AlGaAs cladding layer on the heat sink side can be made thin, thereby making it possible to make easier thermal conduction to the heat sink and enhance a radiating effect.

Thus, a semiconductor laser device can be configured which enables a high-power operation and makes it easy to transfer heat generated with a high-power operation to a radiating body or radiator. By extension, a semiconductor laser can be provided whose high-power operation is high in reliability.

Third Embodiment

Figure 6:
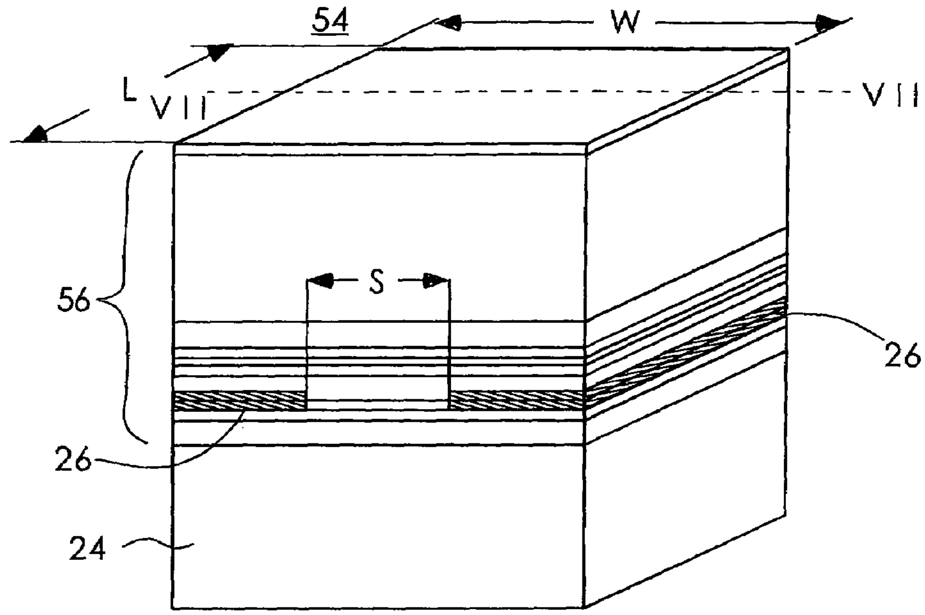
FIG. 6 is a perspective view of a semiconductor laser device according to one embodiment of the present invention.
Figure 7:
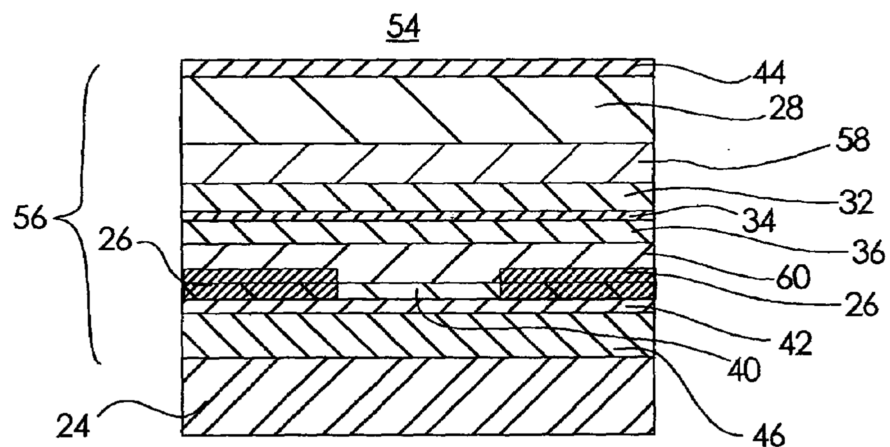
FIG. 7 is a cross-sectional view of the semiconductor laser device as viewed in a section taken along line VII—VII of FIG. 6.

FIG. 6 is a perspective view of a semiconductor laser device according to one embodiment of the present invention. FIG. 7 is a cross-sectional view of the semiconductor laser device as viewed in a section taken along line VII—VII of FIG. 6.

In FIG. 6, the semiconductor laser device 54 shown in FIG. 6 is formed of a semiconductor laser element 56 and a heat sink 24.

Even in the third embodiment, for example, a laser resonator length L=1000 μm, a laser element width W=200 μm, and a stripe width S=60 μm. The thickness of the heat sink 24 is 0.3 mm.

In FIG. 7, the semiconductor laser element 56 includes an n-GaAs substrate 28, and an n-AlGaAs cladding layer 58 (its Al composition ratio x=0.55, and its thickness t=1.5 μm) used as a second semiconductor layer, an undoped AlGaAs guide layer 32 (its Al composition ratio x=0.40, and its thickness t=94 nm) used as a fourth semiconductor layer, an AlGaAs active layer 34 (its Al composition ratio x=0.10, and its thickness t=16 nm), an undoped AlGaAs guide layer 36 (its Al composition ratio x=0.40, and its thickness t=94 nm) used as a third semiconductor layer, a p-AlGaAs cladding layer 60 (its Al composition ratio x=0.9, and its thickness t=1.5 μm) used as a first semiconductor layer and a p-GaAs contact layer 40, all of which are sequentially disposed over the surface of the n-GaAs substrate 28 from the n-GaAs substrate 28 side. Proton injection regions 26 for current restriction are provided on both sides of a stripe corresponding to a region in which a current flows, with the stripe left in the center of an element width. Protons are injected in the direction of depth of each proton injection region 26 so as to range from the surface of the p-GaAs contact layer 40 to the middle of the thickness of the p-AlGaAs cladding layer 60.

Further, a p electrode 42 is provided on the surface of the p-GaAs contact layer 40.

A gold-plated layer 46 having a thickness of about 3 μm is disposed on the surface of the p electrode 42. The gold-plated layer 46 and the heat sink 24 are joined to each other by solder.

An n electrode 44 is formed on the back side of the n-GaAs substrate 28.

The third embodiment is configured in the form of a junction-down (J-DOWN) assembly wherein an epitaxially grown layer formed in the n-GaAs substrate 28 is disposed on the heat sink 24 side.

The operation of the semiconductor laser according to the third embodiment will next be explained.

Since the Al composition ratio of the p-AlGaAs cladding layer 60 in the semiconductor laser device 54 is x=0.90 and the Al composition ratio of the n-AlGaAs cladding layer 58 is x=0.55, the refractive index of the p-AlGaAs cladding layer 60 becomes 3.025 and the refractive index of the n-AlGaAs cladding layer 58 becomes 3.227 by the calculations of their refractive indices from the expression (4).

Thus, the effective refractive indices of the undoped AlGaAs guide layer 32 and n-AlGaAs cladding layer 58 lying on the side opposite to the heat sink 24 with respect to the AlGaAs active layer 34 become higher than the effective refractive indices of the undoped AlGaAs guide layer 36 and p-AlGaAs cladding layer 60 lying on the heat sink 24 side with respect to the AlGaAs active layer 34, considering where the undoped AlGaAs guide layer 32 and undoped AlGaAs guide layer 36 are of structures in which both the refractive index and thickness are symmetric with the AlGaAs active layer 34 interposed therebetween. Therefore, a light intensity distribution extends to the n-AlGaAs cladding layer 58 lying on the side opposite to the heat sink 24 with respect to the AlGaAs active layer 34.

Therefore, the angle θv of expansion of a vertical beam becomes small and an aspect ratio becomes small. Since the beam diameter of a near field pattern (NFP) expands and an optical density is reduced, end-face degradation at high power is lessened and hence the reliability of an LD at a high-power operation is enhanced.

It is understood that since the Al composition ratio of the p-AlGaAs cladding layer 60 lying on the heat sink 24 side with respect to the AlGaAs active layer 34 is x=0.90, and the Al composition ratio of the n-AlGaAs cladding layer 58 lying on the side opposite to the heat sink 24 with respect to the AlGaAs active layer 34 is x=0.55 in the semiconductor laser device 54, thermal conductivity of the p-AlGaAs cladding layer 60 is higher than that of the n-AlGaAs cladding layer 58.

Calculating the thermal resistance of the semiconductor laser device 54 results in 9.06° C./W.

For comparison, the Al composition ratio of the p-AlGaAs cladding layer lying on the heat sink 24 side is set to x=0.55 identical to the Al composition ratio of the n-AlGaAs cladding layer 58, the thickness thereof is set identical to the thickness t=1.5 μm of the p-AlGaAs cladding layer 60, and other specifications are set identical to the semiconductor laser device 54. Then, the thermal resistance is calculated in this condition. Consequently, the thermal resistance of a comparative example 2 having such a symmetric refractive index structure results in 9.54° C./W.

Thus, the semiconductor laser device 54 according to the present embodiment is capable of achieving a 5.0% reduction in thermal resistance as compared with the comparative example 2 in which the p-AlGaAs cladding layer and the n-AlGaAs cladding layer are set identical to each other in Al composition ratio.

Modification 2

Figure 8:
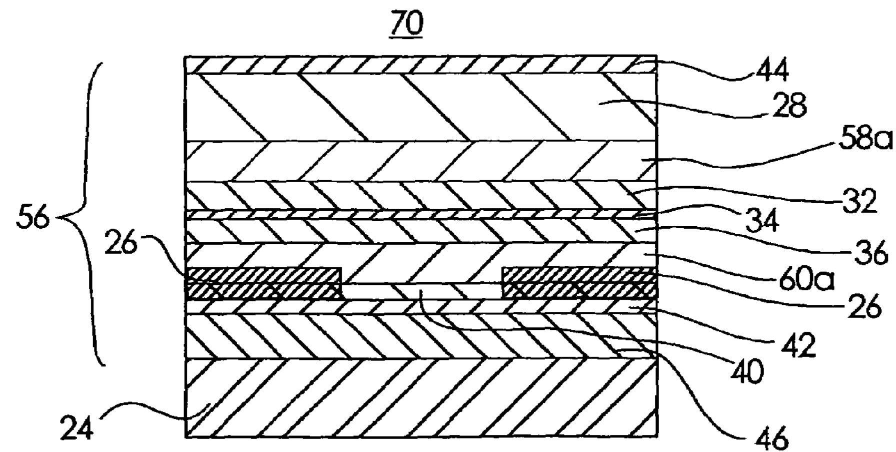
FIG. 8 is a cross-sectional view of a modification of the semiconductor laser device according to one embodiment of the present invention.

FIG. 8 is a cross-sectional view of a modification of the semiconductor laser device according to one embodiment of the present invention. Since FIG. 8 is also basically identical to FIG. 6 in configuration, the position of a section of FIG. 8 also corresponds to the section taken along line VII—VII of FIG. 6.

The semiconductor laser device 70 shown in FIG. 8 is different from the semiconductor laser device 54 in that a p-AlGaAs cladding layer 60*a* is configured with its Al composition ratio as x=0.90 and its thickness as t=0.4 μm, and an n-AlGaAs cladding layer 58*a* is configured with its Al composition ratio as x=0.55 and its thickness as t=2.0 μm. The semiconductor laser device 70 is identical in other configuration to the semiconductor laser device 54.

Even in the case of the semiconductor laser device 70 as well as in the case of the semiconductor laser device 54, the refractive indices of the n-AlGaAs cladding layer 58 and n-AlGaAs cladding layer 58*a* each lying on the side opposite to the heat sink 24 with respect to the AlGaAs active layer 34 become higher than those of the p-AlGaAs cladding layer 60 and n-AlGaAs cladding layer 60*a* each lying on the heat sink 24 side with respect to the AlGaAs active layer 34. Therefore, a light intensity distribution extends to the n-AlGaAs cladding layer 58 and n-AlGaAs cladding layer 58*a* each lying on the side opposite to the heat sink 24. Therefore, even if the thickness of the p-AlGaAs cladding layer 60 lying on the heat sink 24 side becomes slightly thin, the optical influence of the n-GaAs contact layer 40 is not exerted. Thus, in the semiconductor laser device 70, the p-AlGaAs cladding layer 60*a* is set with the Al composition ratio held as x=0.90 as it is and its thickness held thin as t=0.4 μm.

The n-AlGaAs cladding layer 58*a* to which the light intensity distribution extends, holds the Al composition ratio as x=0.55 as it is, and holds its thickness thick as t=2.0 μm to lessen the optical influence of the p-GaAs substrate 28.

In the semiconductor laser device 70 in a manner similar to the semiconductor laser device 54, the thermal conductivity of the p-AlGaAs cladding layer 60*a* is higher than that of the n-AlGaAs cladding layer 58*a*. Further, in the semiconductor laser device 70, the thickness of the p-AlGaAs cladding layer 60*a* is thinner than that of the p-AlGaAs cladding layer 60 of the semiconductor laser device 54, and the distance from the AlGaAs active layer 34 to the heat sink 24 is short. Therefore, thermal conduction to the heat sink becomes easy and hence a radiating effect can be enhanced.

The thermal resistance of the semiconductor laser device 70 results in about 8.38° C./W and is brought to about 12.2% reduction as compared with the thermal resistance of the comparative example 2. The thermal resistance thereof is brought to about 7.5% reduction as compared with the thermal resistance of the semiconductor laser device 54.

Modification 3

Figure 9:
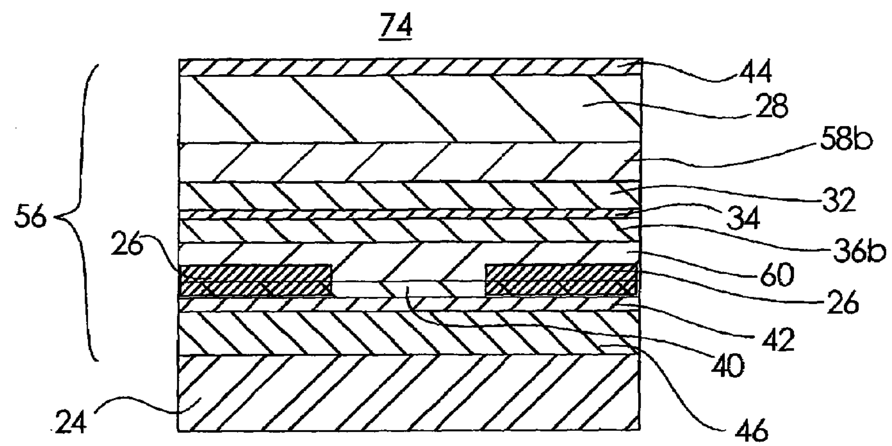
FIG. 9 is a cross-sectional view of a modification of the semiconductor laser device according to one embodiment of the present invention.

FIG. 9 is a cross-sectional view of a modification of the semiconductor laser device according to one embodiment of the present invention. Since FIG. 9 is also basically identical to FIG. 6 in configuration, the position of a section of FIG. 9 also corresponds to the section taken along line VII—VII of FIG. 6.

The semiconductor laser device 74 shown in FIG. 9 is different from the semiconductor laser device 54 in that an n-AlGaAs cladding layer 58*b* is configured with its Al composition ratio as x=0.90 and its thickness as t=1.5 μm, whereby the n-AlGaAs cladding layer **58*b* and p-AlGaAs cladding layer 60 are made identical in Al composition ratio and thickness, and an undoped AlGaAs guide layer 36*b* disposed on the heat sink 24 side with respect to the AlGaAs active layer 34 is configured with its Al composition ratio as x=0.80 and its thickness as t=50 nm, whereby it is made different from the undoped AlGaAs guide layer 32 (its Al composition ratio x=0.40 and its thickness t=94 nm) lying on the side opposite to the heat sink 24 with respect to the AlGaAs active layer 34. The semiconductor laser device 74 is identical in other configuration to the semiconductor laser device 54**.

Although the n-AlGaAs cladding layer **58*b* and the p-AlGaAs cladding layer 60 have the same refractive index in the semiconductor laser device 74, the refractive index of the undoped AlGaAs guide layer 32 lying on the side opposite to the heat sink 24 with respect to the AlGaAs active layer 34 is higher than that of the undoped AlGaAs guide layer 36*b* disposed on the heat sink 24 side with respect to the AlGaAs active layer 34. Therefore, a light intensity distribution extends to the undoped AlGaAs guide layer 32 lying on the side opposite to the heat sink 24 with respect to the AlGaAs active layer 34**.

On the other hand, as to thermal conductivity, the thermal conductivity of the undoped AlGaAs guide layer **36*b* disposed on the heat sink 24 side with respect to the AlGaAs active layer 34 is higher than that of the undoped AlGaAs guide layer 32 on the side opposite to the heat sink 24 with respect to the AlGaAs active layer 34. Therefore, heat generated in the neighborhood of the AlGaAs active layer 34 is easy to conduct into the heat sink 24** and hence thermal radiation becomes satisfactory.

Since the laser resonator length L=1000 μm, the laser element width W=200 μm, and the stripe width S=60 μm even in the semiconductor laser device 74, a thermal resistance from the AlGaAs active layer 34 to the heat sink 24 becomes about 9.04° C./W. Hence the thermal resistance is reduced about 5.2% as compared with the thermal resistance 9.54° C./W of the comparative example 2.

Modification 4

Figure 10:
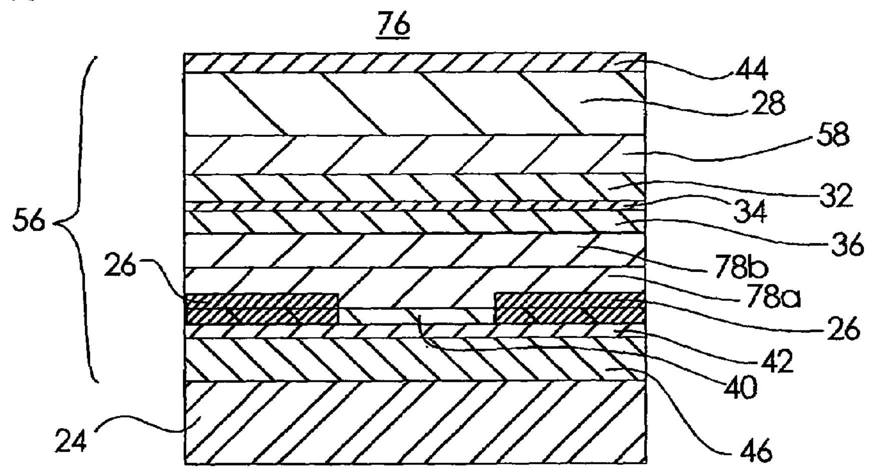
FIG. 10 is a cross-sectional view of a modification of the semiconductor laser device according to one embodiment of the present invention.

FIG. 10 is a cross-sectional view of a modification of the semiconductor laser device according to one embodiment of the present invention. Since FIG. 10 is also basically identical to FIG. 6 in configuration, the position of a section of FIG. 10 also corresponds to the section taken along line VII—VII of FIG. 6.

The semiconductor laser device 76 shown in FIG. 10 is different from the semiconductor laser device 54 in that the semiconductor laser device 54 is constituted of one layer of the p-AlGaAs cladding layer 60, whereas the semiconductor laser device 76 includes a p-AlGaAs first cladding layer **78*a* (its Al composition ratio x=0.55, and its thickness t=0.3 μm) lying on the side near the p-GaAs contact layer 40, and a p-AlGaAs second cladding layer 78*b* (its Al composition ratio x=0.9, and its thickness t=0.2 μm) located on the side near the undoped AlGaAs guide layer 36. The semiconductor laser device 76 is identical in other configuration to the semiconductor laser device 54**.

Since the refractive index of the p-AlGaAs second cladding layer **78*b* is lower than that of the n-AlGaAs cladding layer 58 in the present semiconductor laser device 76, a light intensity distribution extends to the undoped AlGaAs guide layer 32 lying on the side opposite to the heat sink 24**.

On the other hand, as to thermal conductivity, the thermal conductivity of the p-AlGaAs second cladding layer **78*b* disposed on the heat sink 24 side with respect to the AlGaAs active layer 34 is higher than that of the n-AlGaAs cladding layer 58 on the side opposite to the heat sink 24 with respect to the AlGaAs active layer 34, and the sum of the thicknesses of the p-AlGaAs second cladding layer 78*b* and p-AlGaAs first cladding layer 78*a* disposed on the heat sink 24 side is thinner than the thickness of the n-AlGaAs cladding layer 58. Therefore, heat generated in the neighborhood of the AlGaAs active layer 34 is easy to conduct to the heat sink 24** and hence thermal radiation becomes satisfactory.

Since the laser resonator length L=1000 μm, the laser element width W=200 μm, and the stripe width S=60 μm even in the semiconductor laser device 76, a thermal resistance from the AlGaAs active layer 34 to the heat sink 24 becomes about 9.44° C./W. Hence the thermal resistance is reduced about 1% as compared with the thermal resistance 9.54° C./W of the comparative example 2.

In the semiconductor laser device according to the present embodiment as described above, the refractive index of the p-AlGaAs layer disposed on the radiator side with respect to the AlGaAs active layer is set lower than that of the n-AlGaAs layer disposed on the side opposite to the radiator with respect to the AlGaAs active layer. Therefore, the light intensity distribution of the semiconductor laser extends to the n-AlGaAs layer disposed on the side opposite to the radiator and hence a beam diameter is enlarged, whereby an optical density is reduced and end-face degradation at high power is hard to occur. Thus, a high-power operation is enabled and an aspect ratio is reduced. Further, the thermal conduction of the p-AlGaAs layer disposed on the radiator side with respect to the AlGaAs active layer is made better than that of the n-AlGaAs layer disposed on the side opposite to the radiator with respect to the AlGaAs active layer to make it easy to conduct the generated heat of the semiconductor laser to the radiator.

Since the light intensity distribution extends to the n-AlGaAs cladding layer lying on the side opposite to the radiator, the thickness of the p-AlGaAs cladding layer on the heat sink side can be made thin to make it easier to conduct heat to the heat sink, thereby making it possible to enhance a radiating effect.

Thus, a semiconductor laser device can be configured which enables a high-power operation and makes it easy to conduct heat generated with a high-power operation to a radiator or radiating body. By extension, a semiconductor laser whose high-power operation is high in reliability can be provided.

Fourth Embodiment

Figure 11:
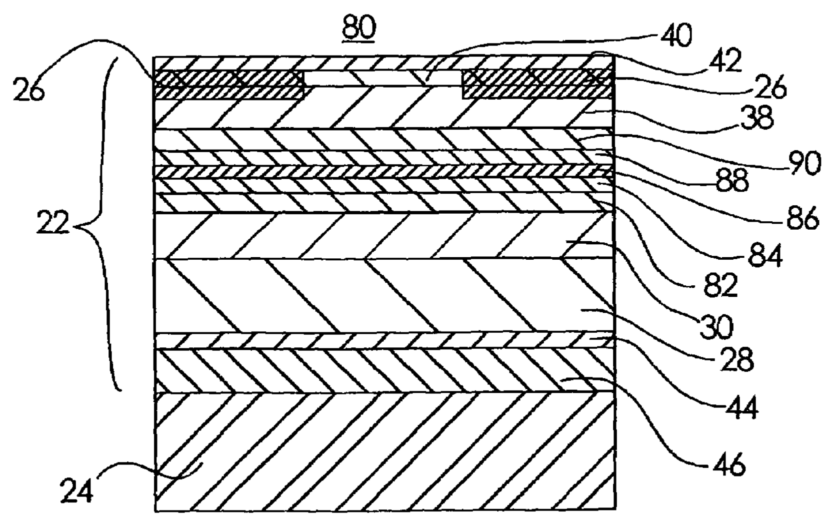
FIG. 11 is a cross-sectional view of a semiconductor laser device according to one embodiment of the present invention.

FIG. 11 is a cross-sectional view of a semiconductor laser device according to one embodiment of the present invention. Even in the fourth embodiment, the semiconductor laser device is identical in basic configuration to the semiconductor laser device shown in FIG. 3. The semiconductor laser device according to the present embodiment is different from the semiconductor laser device shown in FIG. 3 only in that p-side guide layers and n-side guide layers are respectively provided as two layers. The position of a section of FIG. 11 is also identical to the section taken along line IV—IV of FIG. 3.

The semiconductor laser device according to the present embodiment is also configured in the form of a junction-up (J-UP) assembly.

Further, in the semiconductor laser device according to the present embodiment, a cladding layer is constituted of AlGaAs or AlGaInP containing Al, whereas other layers (active layer, guide layers, contact layer, substrate, etc.) are respectively an Al free structure substantially containing no Al.

In FIG. 11, the semiconductor laser device 80 is formed of a semiconductor laser element 22 and a heat sink 24. Even in the semiconductor laser device 80, e.g., a laser resonator length L=1000 μm, a laser element width W=200 μm and a stripe width S=60 μm. The thickness of the heat sink 24 is 0.3 mm.

The semiconductor laser element 22 includes an n-GaAs substrate 28, and an n-AlGaAs cladding layer 30 (its Al composition ratio x=0.90, and its thickness t=1.5 μm), an undoped InGaP guide layer 82 (its Ga composition ratio y=0.51, and its thickness t=120 nm), an undoped InGaAsP guide layer 84 (its Ga composition ratio y=0.63, its As composition ratio z=0.25, and its thickness t=20 nm), an InGaAsP active layer 86 (its Ga composition ratio y=0.87, its As composition ratio z=0.74, and its thickness t=16 nm), an undoped InGaAsP guide layer 88 (its Ga composition ratio y=0.63, its As composition ratio z=0.25, and its thickness t=20 nm), an undoped InGaP guide layer 90 (its Ga composition ratio y=0.51, and its thickness t=120 nm), a p-AlGaAs cladding layer 38 (its Al composition ratio x=0.55, and its thickness t=1.5 μm) and a p-GaAs contact layer 40, all of which are sequentially disposed over the surface of the n-GaAs substrate 28 from the n-GaAs substrate 28 side. Proton injection regions 26 for current restriction are provided on both sides of a stripe corresponding to a region in which a current flows, with the stripe left in the center of an element width. Protons are injected in the direction of depth of each proton injection region 26 so as to range from the surface of the p-GaAs contact layer 40 to the middle of the thickness of the p-AlGaAs cladding layer 38. Further, a p electrode 42 is provided on the surface of the p-GaAs contract layer 40.

An n electrode 44 is formed on the back side of the n-GaAs substrate 28. A gold-plated layer 46 having a thickness of about 3 μm is disposed on the surface of the n electrode. The gold-plated layer 46 and the heat sink 24 are joined to each other by solder.

The fourth embodiment is configured in the form of a junction-up (J-UP) assembly in which the n-GaAs substrate 28 is provided on the heat sink 24 side.

In the semiconductor laser device 80, the undoped InGaP guide layer 82 and undoped InGaAsP guide layer 84, and the undoped InGaAsP guide layer 88 and undoped InGaP guide layer 90 are structures in which their material configurations and thicknesses are symmetric with the InGaAsP active layer 86 interposed therebetween. Since the Al composition ratio of the n-AlGaAs cladding layer 30 in the semiconductor laser device 80 is x=0.90, and the Al composition ratio of the p-AlGaAs cladding layer 38 is x=0.55, the refractive index of the n-AlGaAs cladding layer 30 results in 3.025, and the refractive index of the p-AlGaAs cladding layer 38 results in 3.227 by the calculations of their refractive indices from the expression (4).

Thus, the effective refractive indices of the undoped InGaAsP guide layer 88, undoped InGaP guide layer 90 and p-AlGaAs cladding layer 38 placed on the side opposite to the heat sink 24 with respect to the InGaAsP active layer 86 become higher than the effective refractive indices of the undoped InGaP guide layer 82, undoped InGaAsP guide layer 84 and n-AlGaAs cladding layer 30 placed on the heat sink 24 side with respect to the InGaAsP active layer 86, considering where the undoped InGaP guide layer 82, undoped InGaAsP guide layer 84, InGaAsP active layer 86, undoped InGaAsP guide layer 88 and undoped InGaP guide layer 90 are of structures symmetric in both refractive index and thickness with the InGaAsP active layer 86 interposed therebetween. Therefore, a light intensity distribution extends to the p-AlGaAs cladding layer 38 lying on the side opposite to the heat sink 24.

Therefore, the angle θv of expansion of a vertical beam becomes small and an aspect ratio becomes small.

When the angle θv of expansion of the vertical beam becomes small, the beam diameter of a near field pattern expands and an optical density is reduced. Therefore, end-face degradation at high power is lessened and hence the reliability of an LD at a high-power operation is enhanced.

Further, when the light intensity distribution extends to the p-AlGaAs cladding layer 38 placed on the side opposite to the heat sink 24, the absorption of free carriers caused by the n-AlGaAs cladding layer 30 is reduced so that optical absorption is reduced, thereby making it possible to improve slope efficiency and perform a high-power operation.

On the other hand, since the Al composition ratio of the n-AlGaAs cladding layer 30 lying on the heat sink 24 side with respect to the InGaAsP active layer 86 is x=0.90, and the Al composition ratio of the p-AlGaAs cladding layer 38 lying on the side opposite to the heat sink 24 with respect to the InGaAsP active layer 86 is x=0.55 in the semiconductor laser device 80, thermal conductivity of the n-AlGaAs cladding layer 30 becomes higher than that of the p-AlGaAs cladding layer 38. Therefore, the semiconductor laser device 80 has a configuration wherein it makes it easy to conduct heat generated in the neighborhood of the InGaAsP active layer 86 to the heat sink 24 and is excellent in heat radiation.

Modification 5

Figure 12:
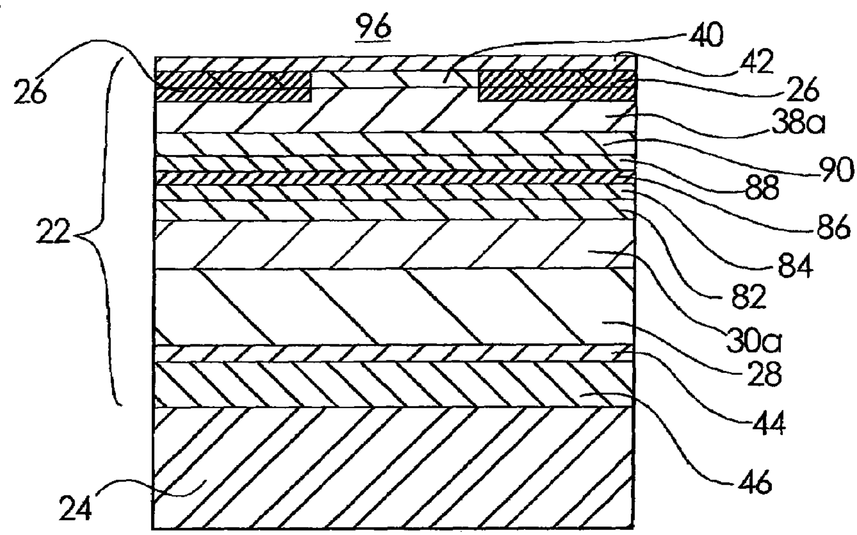
FIG. 12 is a cross-sectional view of a modification of the semiconductor laser device according to one embodiment of the present invention.

FIG. 12 is a cross-sectional view of a modification of the semiconductor laser device according to one embodiment of the present invention. The position of a section of FIG. 12 also corresponds to the section taken along line IV—IV of FIG. 3.

The semiconductor laser device 96 shown in FIG. 12 is different from the semiconductor laser device 80 in that the InGaAsP active layer 86, and the undoped InGaP guide layer 82 and undoped InGaAsP guide layer 84 and the undoped InGaAsP guide layer 88 and undoped InGaP guide layer 90 both provided with the InGaAsP active layer 86 interposed therebetween are made identical to the semiconductor laser device 80 in both material configuration and thickness, whereas an n-AlGaAs cladding layer 30*a* is configured with its Al composition ratio x=0.90 and its thickness t=0.4 μm and a p-AlGaAs cladding layer 38*a* is configured with its Al composition ratio x=0.55 and its thickness t=2.0 μm. The semiconductor laser device 96 is identical in other configuration to the semiconductor laser device 80.

Thus, in the semiconductor laser device 96 in a manner similar to the modification 1, the thickness of the n-AlGaAs cladding layer 30*a* is thinner than that of the n-AlGaAs cladding layer 30 of the semiconductor laser device 80, and the distance from the InGaAsP active layer 86 to the heat sink 24 is short. Therefore, the conduction of heat to the heat sink becomes easy and hence a radiating effect can be enhanced.

Modification 6

Figure 13:
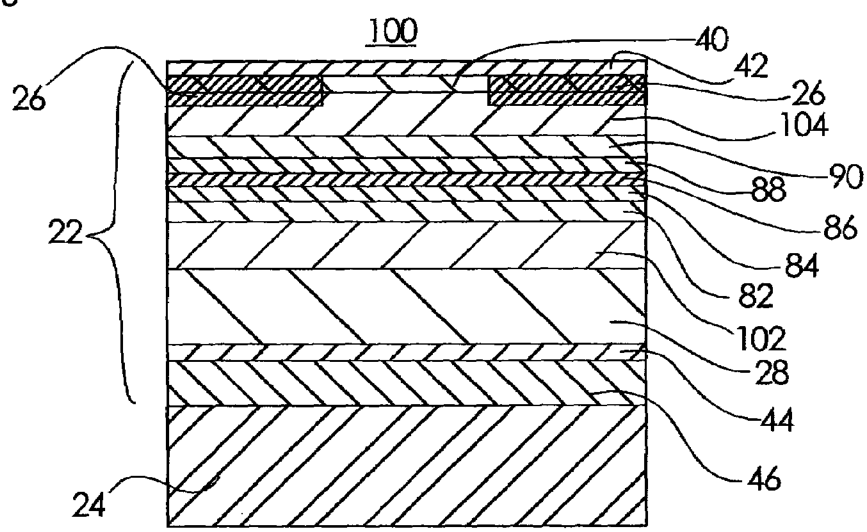
FIG. 13 is a cross-sectional view of a modification of the semiconductor laser device according to one embodiment of the present invention.

FIG. 13 is a cross-sectional view of a modification of the semiconductor laser device according to one embodiment of the present invention. The position of a section of FIG. 13 also corresponds to the section taken along line IV—IV of FIG. 3.

In FIG. 13, the semiconductor laser device 100 is formed of a semiconductor laser element 22 and a heat sink 24. Even in the semiconductor laser device 100, e.g., the laser resonator length L=1000 μm, laser element width W=200 μm and stripe width S=60 μm. The thickness of the heat sink 24 is 0.3 mm.

The semiconductor laser device 100 is different from the semiconductor laser device 80 in that the semiconductor laser device 80 is provided with the n-AlGaAs cladding layer 30 and p-AlGaAs cladding layer 38, whereas the semiconductor laser device 100 is provided with an n-AlGaInP cladding layer 102 (its Al composition ratio l=0.36, its Ga composition ratio m=0.15, its In composition ratio n=0.49, and its thickness t=1.5 μm) and a p-AlGaInP cladding layer 104 (its Al composition ratio l=0.255, its Ga composition ratio m=0.255, its In composition ratio n=0.49, and its thickness t=1.5 μm). The semiconductor laser device 100 is identical in other configuration to the semiconductor laser device 80.

In the semiconductor laser device 100, the undoped InGaP guide layer 82, undoped InGaAsP guide layer 84, the InGaAsP active layer 86, undoped InGaAsP guide layer 88 and undoped InGaP guide layer 90 are of structures symmetric in material configuration and thickness with the InGaAsP active layer 86 interposed between the undoped InGaP guide layer 82 and undoped InGaAsP guide layer 84 and the undoped InGaAsP guide layer 88 and undoped InGaP guide layer 90.

According to H. Tanaka, Y. Kawamura, and H. Asahi, "Refractive indices of $In_{0.49}Ga_{0.51-x}Al_xP$ lattice matched to GaAs", J. App. Phys., Vol. 59, No. 3, 1 Feb. 1986, pp. 985–986, it shows that when AlGaInP increases in Al composition ratio, the refractive index thereof is reduced.

In the semiconductor laser device 100, the Al composition ratio of the n-AlGaInP cladding layer 102 is l=0.36, and the Al composition ratio of the p-AlGaInP cladding layer 104 is l=0.255. Therefore, the refractive index of the p-AlGaInP cladding layer 104 becomes higher than that of the n-AlGaInP cladding layer 102.

Thus, the effective refractive indices of the undoped InGaAsP guide layer 88, undoped InGaP guide layer 90 and p-AlGaInP cladding layer 104 placed on the side opposite to the heat sink 24 with respect to the InGaAsP active layer 86 become higher than the effective refractive indices of the undoped InGaP guide layer 82, undoped InGaAsP guide layer 84 and n-AlGaInP cladding layer 102 placed on the heat sink 24 side with respect to the InGaAsP active layer 86, considering where the undoped InGaP guide layer 82, undoped InGaAsP guide layer 84, InGaAsP active layer 86, undoped InGaAsP guide layer 88 and undoped InGaP guide layer 90 are configures as structures symmetric in material configuration and thickness with the InGaAsP active layer 86 interposed between the undoped InGaP guide layer 82 and undoped InGaAsP guide layer 84 and the undoped InGaAsP guide layer 88 and undoped InGaP guide layer 90.

Thus, a light intensity distribution extends to the p-AlGaInP cladding layer 104 lying on the side opposite to the heat sink 24.

Therefore, the angle θv of expansion of a vertical beam becomes small and an aspect ratio becomes small. When the angle θv of expansion of the vertical beam becomes small, the beam diameter of a near field pattern expands and an optical density is reduced. Therefore, end-face degradation at high power is lessened and hence the reliability of an LD at a high-power operation is enhanced.

Further, when the light intensity distribution extends to the p-AlGaInP cladding layer 104 placed on the side opposite to the heat sink 24, the absorption of free carriers caused by the n-AlGaInP cladding layer 102 is reduced so that optical absorption is reduced, thereby making it possible to improve slope efficiency and perform a high-power operation.

According to H. Fujii, Y. Ueno, and K. Endo, "Effect of thermal resistivity on the catastrophic optical damage power density of AlGaInP laser diodes", Appl. Phys. Lett. Vol. 62, no. 17, 26 Apr. 1993, it shows that when AlGaInP increases in Al composition ratio, its thermal conductivity becomes high.

In the semiconductor laser device 100, the Al composition ratio of the n-AlGaInP cladding layer 102 is l=0.36, and the Al composition ratio of the p-AlGaInP cladding layer 104 is l=0.255. Therefore, the thermal conductivity of the n-AlGaInP cladding layer 102 disposed on the heat sink 24 side with respect to the InGaAsP active layer 86 becomes higher than that of the p-AlGaInP cladding layer 104 disposed on the side opposite to the heat sink 24 with respect to the InGaAsP active layer 86. Therefore, the semiconductor laser device 100 takes a configuration wherein it makes it easy to conduct heat generated in the neighborhood of the InGaAsP active layer 86 to the heat sink 24 and is excellent in heat radiation.

Modification 7

Figure 14:
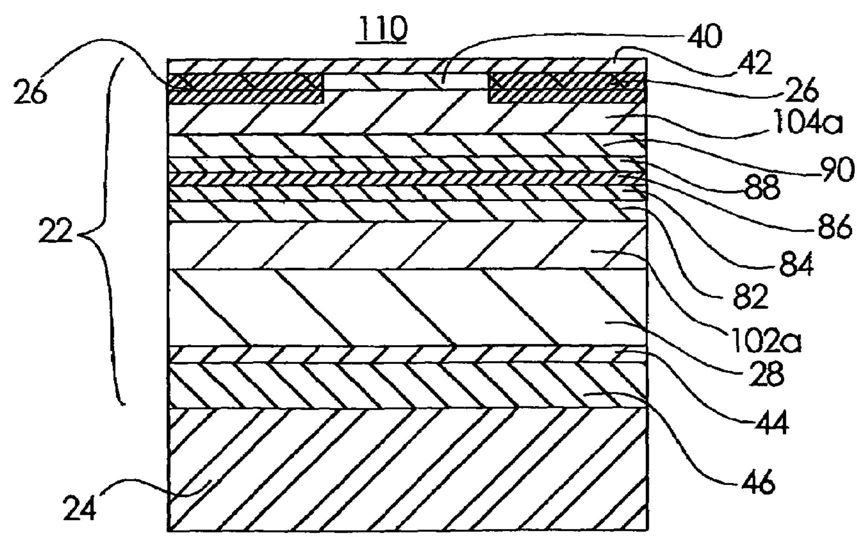
FIG. 14 is a cross-sectional view of a modification of the semiconductor laser device according to one embodiment of the present invention.

FIG. 14 is a cross-sectional view of a modification of the semiconductor laser device according to one embodiment of the present invention. The position of a section of FIG. 14 also corresponds to the section taken along line IV—IV of FIG. 3.

The semiconductor laser device 110 shown in FIG. 14 is different from the semiconductor laser device 100 in that the InGaAsP active layer 86, and the undoped InGaP guide layer 82 and undoped InGaAsP guide layer 84 and the undoped InGaAsP guide layer 88 and undoped InGaP guide layer 90 both provided with the InGaAsP active layer 86 interposed therebetween are made identical to the semiconductor laser device 100 in both material configuration and thickness, and an n-AlGaInP cladding layer 102*a* is configured with its Al composition ratio l=0.36, its Ga composition ratio m=0.15, its In composition ratio n=0.49 and its thickness t=0.4 μm and a p-AlGaInP cladding layer 104*a* is configured with its Al composition ratio l=0.255, its Ga composition ratio m=0.255, its In composition ratio n=0.49 and its thickness t=2.0 μm. The semiconductor laser device 110 is identical in other configuration to the semiconductor laser device 100.

Thus, in the semiconductor laser device 110, the thickness of the n-AlGaInP cladding layer 102*a* is thinner than that of the n-AlGaInP cladding layer 102 of the semiconductor laser device 100 and the distance from the InGaAsP active layer 86 to the heat sink 24 is short due to the reason similar to the modification 1. Therefore, the conduction of heat to the heat sink becomes easy and hence a radiating effect can be enhanced.

As described above, the semiconductor laser device according to the present embodiment is configured as a semiconductor laser device wherein a cladding layer is constituted of AlGaAs or AlGaInP containing Al, whereas other layers (active layer, guide layers, contact layer, substrate, etc.) are respectively provided as an Al free structure substantially containing no Al, and has an effect similar to the second embodiment.

Fifth Embodiment

Figure 15:
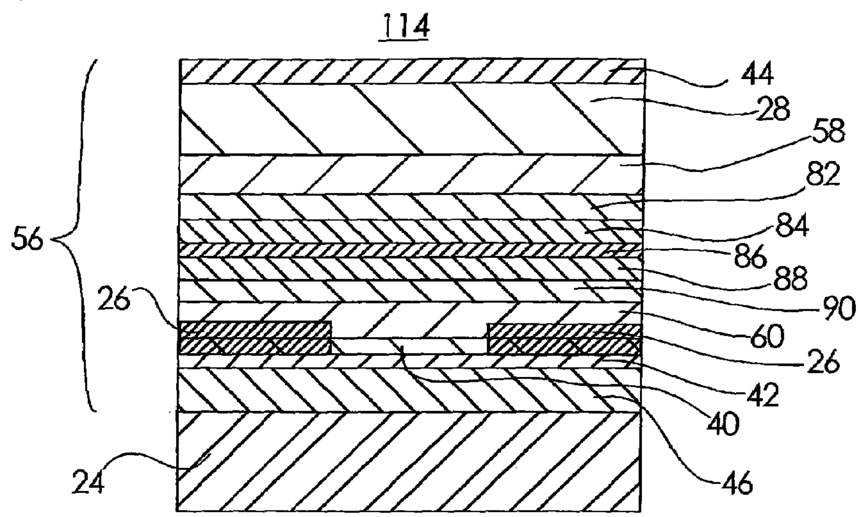
FIG. 15 is a cross-sectional view of a semiconductor laser device according to one embodiment of the present invention.

FIG. 15 is a cross-sectional view of a semiconductor laser device according to one embodiment of the present invention. Even in the fifth embodiment, the semiconductor laser device is identical in basic configuration to the semiconductor laser device shown in FIG. 6. The semiconductor laser device according to the present embodiment is different from the semiconductor laser device shown in FIG. 6 only in that p-side guide layers and n-side guide layers are respectively provided as two layers. The position of a section of FIG. 15 is also a position of the same section as the section taken along line VII—VII of FIG. 6.

The semiconductor laser device according to the present embodiment is also configured in the form of a junction-down (J-DOWN) assembly.

Further, in the semiconductor laser device according to the present embodiment, a cladding layer is constituted of AlGaAs or AlGaInP containing Al, whereas other layers (active layer, guide layers, contact layer, substrate, etc.) are respectively an Al free structure substantially containing no Al.

In FIG. 15, the semiconductor laser device 114 is formed of a semiconductor laser element 56 and a heat sink 24. Even in the semiconductor laser device 114, e.g., a laser resonator length L=1000 μm, a laser element width W=200 μm and a stripe width S=60 μm. The thickness of the heat sink 24 is 0.3 mm.

The semiconductor laser element 56 of the semiconductor laser device 114 includes an n-GaAs substrate 28, and an n-AlGaAs cladding layer 58 (its Al composition ratio x=0.55, and its thickness t=1.5 μm) used as a second semiconductor layer, an undoped InGaP guide layer 82 (its Ga composition ratio y=0.51, and its thickness t=120 nm), an undoped InGaAsP guide layer 84 (its Ga composition ratio y=0.63, its As composition ratio z=0.25, and its thickness t=20 nm), an InGaAsP active layer 86 (its Ga composition ratio y=0.87, its As composition ratio z=0.74, and its thickness t=16 nm), an undoped InGaAsP guide layer 88 (its Ga composition ratio y=0.63, its As composition ratio z=0.25, and its thickness t=20 nm), an undoped InGaP guide layer 90 (its Ga composition ratio y=0.51, and its thickness t=120 nm), a p-AlGaAs cladding layer 60 (its Al composition ratio x=0.9, and its thickness t=1.5 μm) used as a first semiconductor layer and a p-GaAs contact layer 40, all of which are sequentially disposed over the surface of the n-GaAs substrate 28 from the n-GaAs substrate 28 side.

Proton injection regions 26 for current restriction are provided on both sides of a stripe corresponding to a region in which a current flows, with the stripe left in the center of an element width. Protons are injected in the direction of depth of each proton injection region 26 so as to range from the surface of the p-GaAs contact layer 40 to the middle of the thickness of the p-AlGaAs cladding layer 60.

Further, a p electrode 42 is provided on the surface of the p-GaAs contract layer 40. A gold-plated layer 46 having a thickness of about 3 μm is disposed on the surface of the p electrode 42. The gold-plated layer 46 and the heat sink 24 are joined to each other by solder.

In the semiconductor laser device 114, the undoped InGaP guide layer 82 and undoped InGaAsP guide layer 84, and the undoped InGaAsP guide layer 88 and undoped InGaP guide layer 90 are structures in which their material configurations and thicknesses are symmetric with the InGaAsP active layer 86 interposed therebetween.

Since the Al composition ratio of the n-AlGaAs cladding layer 58 in the semiconductor laser device 114 is x=0.55, and the Al composition ratio of the p-AlGaAs cladding layer 60 is x=0.9, the refractive index of the n-AlGaAs cladding layer 58 results in 3.227, and the refractive index of the p-AlGaAs cladding layer 60 results in 3.025 by the calculations of their refractive indices from the expression (4). Thus, the effective refractive indices of the undoped InGaP guide layer 82, undoped InGaAsP guide layer 84 and n-AlGaAs cladding layer 58 placed on the side opposite to the heat sink 24 with respect to the InGaAsP active layer 86 become higher than the effective refractive indices of the undoped InGaAsP guide layer 88, undoped InGaP guide layer 90 and p-AlGaAs cladding layer 60 placed on the heat sink 24 side with respect to the InGaAsP active layer 86, considering where the undoped InGaP guide layer 82 and undoped InGaAsP guide layer 84, and the undoped InGaAsP guide layer 88 and undoped InGaP guide layer 90 are of structures symmetric in material configuration and thickness with the InGaAsP active layer 86 interposed therebetween. Therefore, a light intensity distribution extends to the n-AlGaAs cladding layer 58 lying on the side opposite to the heat sink 24. Therefore, the angle θv of expansion of a vertical beam becomes small and an aspect ratio becomes small.

When the angle θv of expansion of the vertical beam becomes small, the beam diameter of a near field pattern expands and an optical density is reduced. Therefore, end-face degradation at high power is lessened and hence the reliability of an LD at a high-power operation is enhanced.

On the other hand, since the Al composition ratio of the p-AlGaAs cladding layer 60 lying on the heat sink 24 side with respect to the InGaAsP active layer 86 is x=0.90, and the Al composition ratio of the n-AlGaAs cladding layer 58 lying on the side opposite to the heat sink 24 with respect to the InGaAsP active layer 86 is x=0.55 in the semiconductor laser device 114, thermal conductivity of the p-AlGaAs cladding layer 60 becomes higher than that of the n-AlGaAs cladding layer 58. Therefore, the semiconductor laser device 114 has a configuration wherein it makes it easy to conduct heat generated in the neighborhood of the InGaAsP active layer 86 to the heat sink 24 and is excellent in heat radiation.

Modification 8

Figure 16:
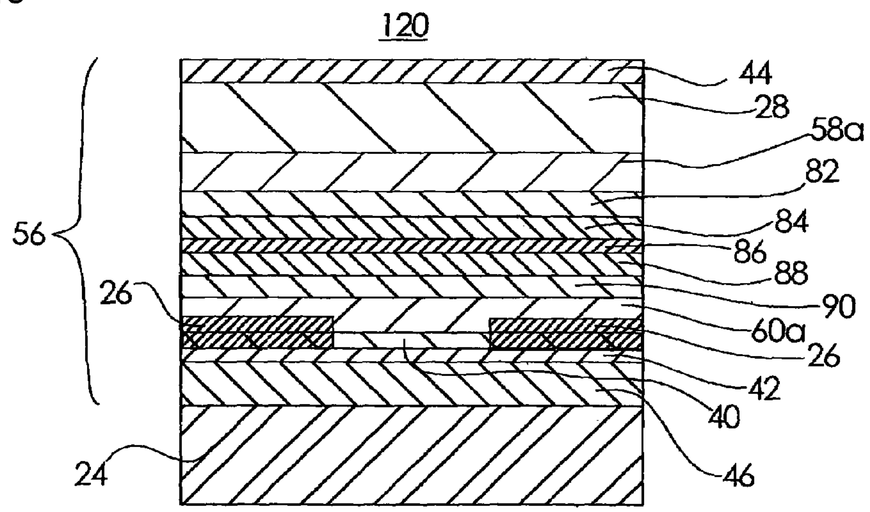
FIG. 16 is a cross-sectional view of a modification of the semiconductor laser device according to one embodiment of the present invention.

FIG. 16 is a cross-sectional view of a modification of the semiconductor laser device according to one embodiment of the present invention. The position of a section of FIG. 16 also corresponds to the position of the same section as the section taken along line VII—VII of FIG. 6. The semiconductor device according to the modification 8 is also configured in the form of a junction-down (J-DOWN) assembly.

The semiconductor laser device 120 shown in FIG. 16 is different from the semiconductor laser device 114 in that the InGaAsP active layer 86, and the undoped InGaP guide layer 82 and undoped InGaAsP guide layer 84 and the undoped InGaAsP guide layer 88 and undoped InGaP guide layer 90 both provided with the InGaAsP active layer 86 interposed therebetween are made identical to the semiconductor laser device 80 in both material configuration and thickness, whereas a p-AlGaAs cladding layer **60*a* is configured with its Al composition ratio x=0.90 and its thickness t=0.4 μm and an n-AlGaAs cladding layer 58*a* is configured with its Al composition ratio x=0.55 and its thickness t=2.0 μm. The semiconductor laser device 120 is identical in other configuration to the semiconductor laser device 114**.

Thus, in the semiconductor laser device 120, the thickness of the p-AlGaAs cladding layer **60*a* is thinner than that of the p-AlGaAs cladding layer 60 of the semiconductor laser device 114 and the distance from the AlGaAs active layer 34 to the heat sink 24 is short, in a manner similar to the modification 2. Therefore, the transfer of heat to the heat sink becomes easier than the semiconductor laser device 114** and hence a radiating effect can be enhanced.

Modification 9

Figure 17:
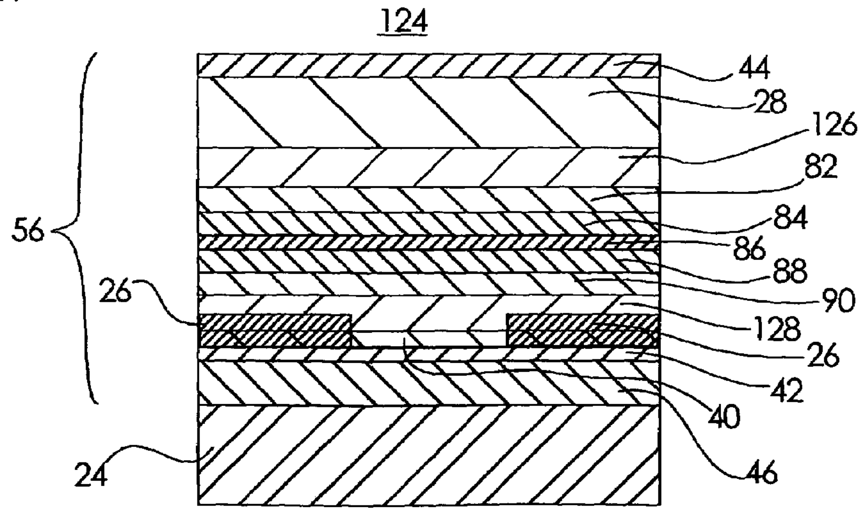
FIG. 17 is a cross-sectional view of a modification of the semiconductor laser device according to one embodiment of the present invention.

FIG. 17 is a cross-sectional view of a modification of the semiconductor laser device according to one embodiment of the present invention. The position of a section of FIG. 17 is also identical to the section taken along line VII—VII of FIG. 6.

In FIG. 17, the semiconductor laser device 124 is formed of a semiconductor laser element 56 and a heat sink 24. Even in the semiconductor laser device 124, e.g., the laser resonator length L=1000 μm, the laser element width W=200 μm and the stripe width S=60 μm. The thickness of the heat sink 24 is 0.3 mm.

The semiconductor laser device 124 is different from the semiconductor laser device 114 in that the semiconductor laser device 114 is provided with the n-AlGaAs cladding layer 60 and p-AlGaAs cladding layer 58, whereas the semiconductor laser device 124 is provided with an n-AlGaInP cladding layer 126 (its Al composition ratio l=0.255, its Ga composition ratio m=0.255, its In composition ratio n=0.49, and its thickness t=1.5 μm) and a p-AlGaInP cladding layer 128 (its Al composition ratio l=0.36, its Ga composition ratio m=0.15, its In composition ratio n=0.49, and its thickness t=1.5 μm). The semiconductor laser device 124 is identical in other configuration to the semiconductor laser device 114.

In the semiconductor laser device 124, the undoped InGaP guide layer 82 and undoped InGaAsP guide layer 84, and the undoped InGaAsP guide layer 88 and undoped InGaP guide layer 90 are of structures symmetric in material configuration and thickness with the InGaAsP active layer 86 interposed therebetween.

Since the refractive index of AlGaInP is reduced as its Al composition ratio increases, the refractive index of the n-AlGaInP cladding layer 126 becomes higher than that of the p-AlGaInP cladding layer 128. Thus, if consideration is given to the fact that the undoped InGaP guide layer 82 and undoped InGaAsP guide layer 84, and the undoped InGaAsP guide layer 88 and undoped InGaP guide layer 90 are respectively brought to structures symmetric in material configuration and thickness with the InGaAsP active layer 86 interposed therebetween, effective refractive indices of the undoped InGaP guide layer 82, undoped InGaAsP guide layer 84 and n-AlGaInP cladding layer 126 disposed on the side opposite to the heat sink 24 with respect to the InGaAsP active layer 86 become higher than those of the undoped InGaAsP guide layer 88, undoped InGaP guide layer 90 and p-AlGaInP cladding layer 128 disposed on the heat sink 24 side with respect to the InGaAsP active layer 86.

Thus, a light intensity distribution extends to the n-AlGaInP cladding layer 126 lying on the side opposite to the heat sink 24. Therefore, the angle θv of expansion of a vertical beam becomes small and an aspect ratio becomes small.

When the angle θv of expansion of the vertical beam becomes small, the beam diameter of a near field pattern expands and an optical density is reduced. Therefore, endface degradation at high power is lessened and hence the reliability of an LD at a high-power operation is enhanced.

Since AlGaInP goes increase in thermal conductivity as its Al composition ratio increases, the thermal conductivity of the p-AlGaInP cladding layer 128 disposed on the heat sink 24 side with respect to the InGaAsP active layer 86 becomes higher than that of the n-AlGaInP cladding layer 126 disposed on the side opposite to the heat sink 24 with respect to the InGaAsP active layer 86. Therefore, the present semiconductor laser device is brought to a configuration which makes it easy to conduct heat generated in the vicinity of the InGaAsP active layer 86 to the heat sink 24 and is excellent in heat radiation.

Modification 10

Figure 18:
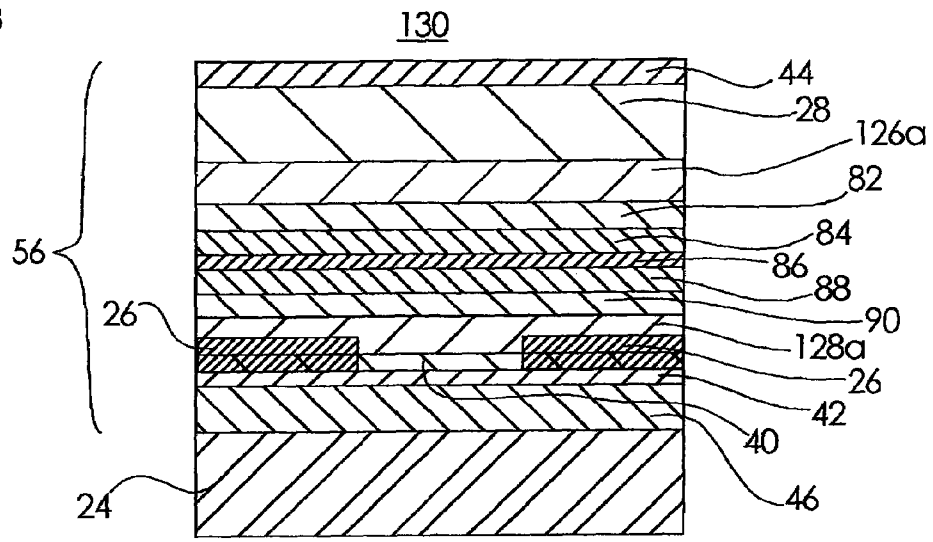
FIG. 18 is a cross-sectional view of a modification of the semiconductor laser device according to one embodiment of the present invention.

FIG. 18 is a cross-sectional view of a modification of the semiconductor laser device according to one embodiment of the present invention. The position of a section of FIG. 18 also corresponds to the position of the same section as the section taken along line VII—VII of FIG. 6.

The semiconductor laser device 130 shown in FIG. 18 is different from the semiconductor laser device 124 in that the InGaAsP active layer 86, and the undoped InGaP guide layer 82 and undoped InGaAsP guide layer 84 and the undoped InGaAsP guide layer 88 and undoped InGaP guide layer 90 both provided with the InGaAsP active layer 86 interposed therebetween are made identical to the semiconductor laser device 124 in both material configuration and thickness, and a p-AlGaInP cladding layer **128*a* is configured with its Al composition ratio l=0.36, its Ga composition ratio m=0.15, its In composition ratio n=0.49 and its thickness t=0.4 μm and an n-AlGaInP cladding layer 126*a* is configured with its Al composition ratio l=0.255, its Ga composition ratio m=0.255, its In composition ratio n=0.49 and its thickness t=2.0 μm. The semiconductor laser device 130 is identical in other configuration to the semiconductor laser device 124**.

Thus, in the semiconductor laser device 130, the thickness of the p-AlGaInP cladding layer **128*a* is thinner than that of the p-AlGaInP cladding layer 128 of the semiconductor laser device 124 and the distance from the InGaAsP active layer 86 to the heat sink 24 is short, due to the reason similar to the modification 2. Therefore, the conduction of heat to the heat sink becomes easier as compared with the semiconductor laser device 124** and hence a radiating effect can be enhanced.

As described above, the semiconductor laser device according to the present embodiment is configured as a semiconductor laser device wherein a cladding layer is constituted of AlGaAs or AlGaInP containing Al, whereas other layers (active layer, guide layers, contact layer, substrate, etc.) are respectively provided as an Al free structure substantially containing no Al, and has an effect similar to the third embodiment.

Sixth Embodiment

Figure 19:
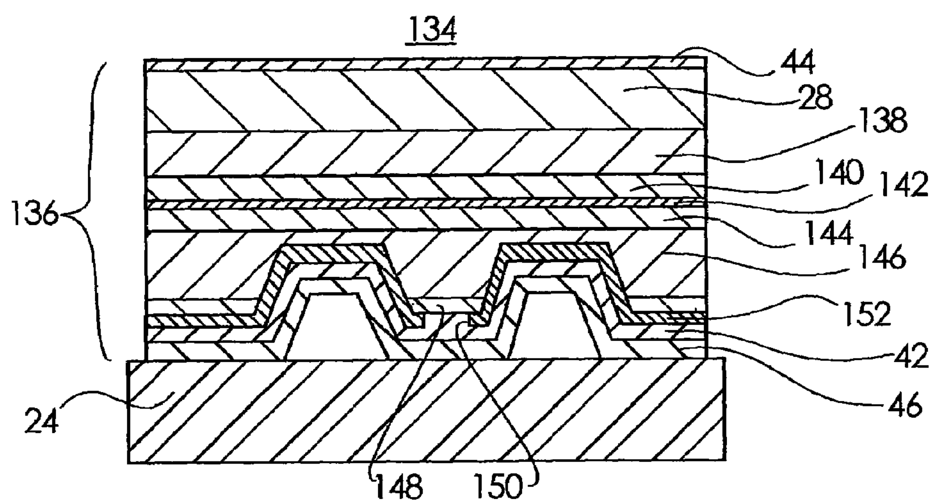
FIG. 19 is a cross-sectional view of a semiconductor laser device according to one embodiment of the present invention.

FIG. 19 is a cross-sectional view of a semiconductor laser device according to one embodiment of the present invention.

In FIG. 19, the semiconductor laser device 134 is a red semiconductor laser device having a ridge waveguide structure whose oscillation wavelength is about 650 nm, and is formed of a semiconductor laser element 136 and a heat sink 24.

In FIG. 19, the semiconductor laser element 136 includes an n-GaAs substrate 28, and an n-AlGaInP cladding layer 138 (its Al composition ratio l=0.31, its Ga composition ratio m=0.20, its In composition ratio n=0.49, and its thickness t=2.0 μm) used as a second semiconductor layer, an undoped AlGaInP guide layer 140 (its Al composition ratio l=0.23, its Ga composition ratio m=0.28, its In composition ratio n=0.49, and its thickness t=100 nm) used as a fourth semiconductor layer, an undoped compression distortion GaInP active layer 142 (its Ga composition ratio m=0.44, its In composition ratio n=0.56, and its thickness t=10 nm), an undoped AlGaInP guide layer 144 (its Al composition ratio l=0.23, its Ga composition ratio m=0.28, its In composition ratio n=0.49, and its thickness t=100 nm) used as a third semiconductor layer, a p-AlGaInP cladding layer 146 (its Al composition ratio l=0.36, its Ga composition ratio m=0.15, its In composition ratio=0.49, and its thickness t=1.0 μm) used as a first semiconductor layer, and a p-GaAs contact layer 148, all of which are sequentially disposed over the surface of the n-GaAs substrate 28 from the n-GaAs substrate 28 side.

The p-AlGaInP cladding layer 146 and the p-GaAs contact layer 148 form a ridge waveguide. An insulating film 152 having an opening 150 defined in the top of the ridge waveguide is formed on the surface of the p-GaAs contact layer 148. A p electrode 42 is disposed on the opening 150 and the insulating film 152, and an n electrode 44 is disposed on the back side of the n-GaAs substrate 28. A gold-plated layer 46 is disposed on the surface of the p electrode 42, and the semiconductor laser element 136 is joined to the heat sink 24 via the gold-plated layer 46 by solder.

Although the semiconductor laser device 134 according to the present embodiment is configured as a junction-down (J-DOWN) assembly, it may be configured as a junction-up (J-UP) assembly.

In the semiconductor laser device 134, the refractive index of the n-AlGaInP cladding layer 138 becomes higher than that of the p-AlGaInP cladding layer 146. Therefore, effective refractive indices of the undoped AlGaInP guide layer 140 and n-AlGaInP cladding layer 138 disposed on the side opposite to the heat sink 24 with respect to the undoped compression distortion GaInP active layer 142 become higher than those of the undoped AlGaInP guide layer 144 and p-AlGaInP cladding layer 146 disposed on the heat sink 24 side with respect to the undoped compression distortion GaInP active layer 142. Thus, a light intensity distribution extends principally to the n-AlGaInP cladding layer 138 disposed on the side opposite to the heat sink 24. Therefore, since the angle θv of expansion of a vertical beam becomes small and the angle θh of expansion of a horizontal beam does not change in particular, an aspect ratio corresponding to the ratio of the angle θv to the angle θh becomes small.

When the angle θv of expansion of the vertical beam becomes small, the beam diameter of a near field pattern expands and an optical density is reduced. Therefore, end-face degradation at high power is lessened and hence the reliability of an LD at a high-power operation is enhanced.

Since AlGaInP goes increase in thermal conductivity as its Al composition ratio increases, the thermal conductivity of the p-AlGaInP cladding layer 146 disposed on the heat sink 24 side becomes higher than that of the n-AlGaInP cladding layer 138 disposed on the side opposite to the heat sink 24. Thus, heat generated in the vicinity of the undoped compression distortion GaInP active layer 142 is easy to conduct to the heat sink 24 and hence a radiating effect is enhanced.

Further, the light intensity distribution extends principally to the n-AlGaInP cladding layer 138 lying on the side opposite to the heat sink 24. Therefore, even if the thickness of the p-AlGaInP cladding layer 146 lying on the heat sink 24 side is reduced to a thickness of 1.0 μm, the optical influence of the p-GaAs contact layer 148 is not exerted. On the other hand, the n-AlGaInP cladding layer 138 disposed on the expansion side of the light intensity distribution is increased to a thickness of 2.0 μm to lessen the optical influence of the n-GaAs substrate 28. Thus, the distance from the undoped compression distortion GaInP active layer 142 to the heat sink 24 can be shortened, thereby making it possible to further enhance a radiating effect.

Modification 11

Figure 20:
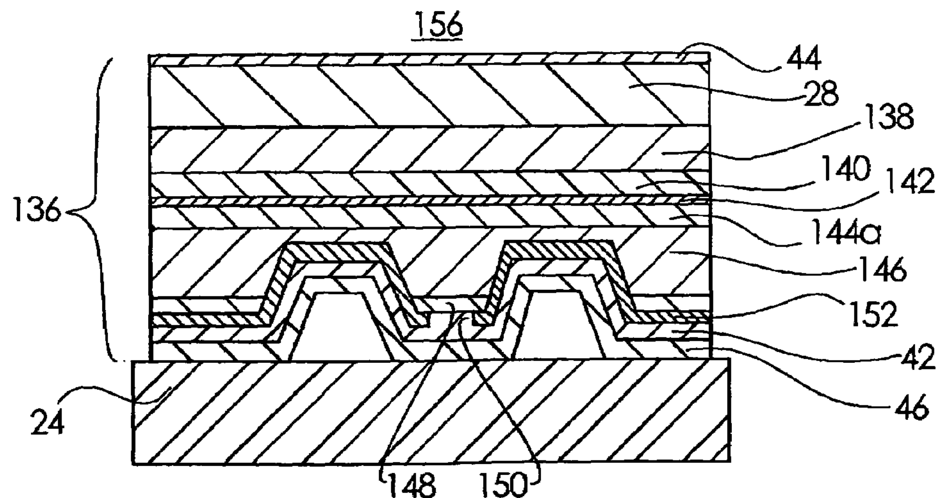
FIG. 20 is a cross-sectional view of a modification of the semiconductor laser device according to one embodiment of the present invention.

FIG. 20 is a cross-sectional view of a modification of the semiconductor laser device according to one embodiment of the present invention.

In FIG. 20, the semiconductor laser device 156 is different from the semiconductor laser device 134 in the following points.

In the semiconductor laser device 134, the n-AlGaInP cladding layer 138 and the p-AlGaInP cladding layer 146 have been set to such a structure that they are asymmetric with respect to the undoped compression distortion GaInP active layer 142, whereas the undoped AlGaInP guide layer 140 and the undoped AlGaInP guide layer 144 have been made identical in material configuration and thickness and set to such a structure that they are symmetric with respect to the undoped compression distortion GaInP active layer 142.

In the semiconductor laser device 156, however, the n-AlGaInP cladding layer 138 and p-AlGaInP cladding layer 146 are set to such a structure as to be asymmetric with respect to the undoped compression distortion GaInP active layer 142. Further, the undoped AlGaInP guide layer 140 and an undoped AlGaInP guide layer **144*a* are set to such a structure as to be asymmetric with respect to the undoped compression distortion GaInP active layer 142**.

That is, the undoped AlGaInP guide layer **144*a*** is configured with its Al composition ratio l=0.25, its Ga composition ratio m=0.26, its In composition ratio n=0.49, and its thickness t=70 nm.

Thus, the semiconductor laser device 156 enables a radiating effect much higher than the semiconductor laser device 134.

Incidentally, although the present modification is set to such a structure that the guide layers and cladding layers are both asymmetric, it is needless to say that even if the cladding layers are set to the symmetric structure and the guide layers are set to the asymmetric structure, commensurate radiating effects are enabled.

Modification 12

Figure 21:
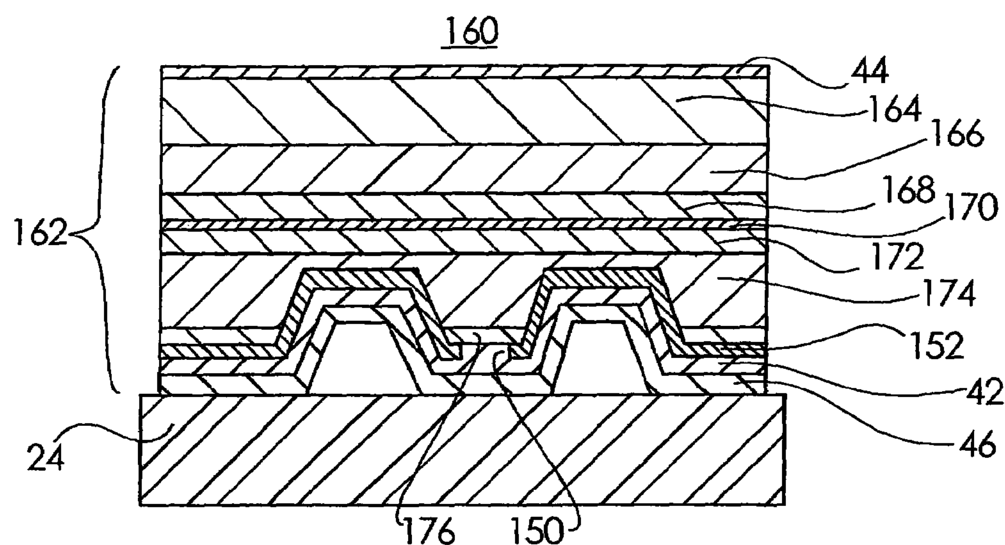
FIG. 21 is a cross-sectional view of a modification of the semiconductor laser device according to one embodiment of the present invention.

FIG. 21 is a cross-sectional view of a modification of the semiconductor laser device according to one embodiment of the present invention.

The semiconductor laser device 160 shown in FIG. 21 is a semiconductor laser device having a ridge waveguide structure whose oscillation wavelength is about 1480 nm, and is formed of a semiconductor laser element 162 and a heat sink 24.

In FIG. 21, the semiconductor laser element 162 includes an n-InP substrate 164, and an n-InGaAsP cladding layer 166 (its bandgap wavelength λg=0.99 μm, and its thickness t=2.0 μm) used as a second semiconductor layer, an undoped InGaAsP guide layer 168 (its bandgap wavelength λg=1.08 μm, and its thickness t=150 nm) used as a fourth semiconductor layer, an undoped InGaAsP active layer 170 (its bandgap wavelength λg=1.48 μm, and its thickness t=10 nm), an undoped InGaAsP guide layer 172 (its bandgap wavelength λg=1.08 μm, and its thickness t=150 nm) used as a third semiconductor layer, a p-InP cladding layer 174 (its thickness t=1.0 μm) used as a first semiconductor layer, and a p-InP contact layer 176, all of which are sequentially disposed over the surface of the n-InP substrate 164 from the n-InP substrate 164 side. The p-InP cladding layer 174 and the p-InP contact layer 176 form a ridge waveguide, and an insulating film 152 having an opening 150 located in the top of the ridge waveguide is formed on the surface of the p-InP contact layer 176. A p electrode 42 is disposed on the opening 150 and the insulating film 152, and an n electrode 44 is disposed on the back side of the n-InP substrate 164. A gold-plated layer 46 is disposed on the surface of the p electrode 42. The semiconductor laser element 162 is joined to the heat sink 24 via the gold-plated layer 46 interposed therebetween by solder.

In the semiconductor laser device 160, the refractive index of the n-InGaAsP cladding layer 166 is higher than that of the p-InP cladding layer 174. Thus, the effective refractive indices of the undoped InGaAsP guide layer 168 and the n-InGaAsP cladding layer 166 disposed on the side opposite to the heat sink 24 with respect to the undoped InGaAsP active layer 170 become higher than the refractive indices of the undoped InGaAsP guide layer 172 and the p-InP cladding layer 174 disposed on the heat sink 24 side with respect to the undoped InGaAsP active layer 170. Therefore, a light intensity distribution extends principally to the n-InGaAsP cladding layer 166 disposed on the side opposite to the heat sink 24. Thus, since the angle θv of expansion of a vertical beam becomes small and the angle θh of expansion of a horizontal beam does not change in particular, an aspect ratio corresponding to the ratio of the angle θv to the angle θh becomes small.

When the angle θv of expansion of the vertical beam becomes small, the beam diameter of a near field pattern expands and an optical density is reduced. Therefore, end-face degradation at high power is lessened and hence the reliability of an LD at a high-power operation is enhanced.

As to thermal conductivity, the thermal conductivity of the p-InP cladding layer 174 corresponding to binary composition disposed on the heat sink 24 side becomes higher than that of the n-InGaAsP cladding layer 166 corresponding to quaternary composition disposed on the side opposite to the heat sink 24. Heat generated in the vicinity of the undoped InGaAsP active layer 170 is easy to conduct to the heat sink 24 and hence a radiating effect is enhanced.

Further, a light intensity distribution extends principally to the n-InGaAsP cladding layer 166 disposed on the side opposite to the heat sink 24. Since the contact layer is also p-InP, the optical influence of the p-InP contact layer 176 is not exerted even if the thickness of the p-InP cladding layer 174 disposed on the heat sink 24 side is reduced to a thickness of 1.0 μm. On the other hand, the n-InGaAsP cladding layer 166 disposed on the expansion side of the light intensity distribution is increased to a thickness of 2.0 μm to lessen the optical influence of the n-InP substrate 164. Thus, the distance from the undoped InGaAsP active layer 170 to the heat sink 24 can be shortened, thereby making it possible to further enhance a radiating effect.

Modification 13

Figure 22:
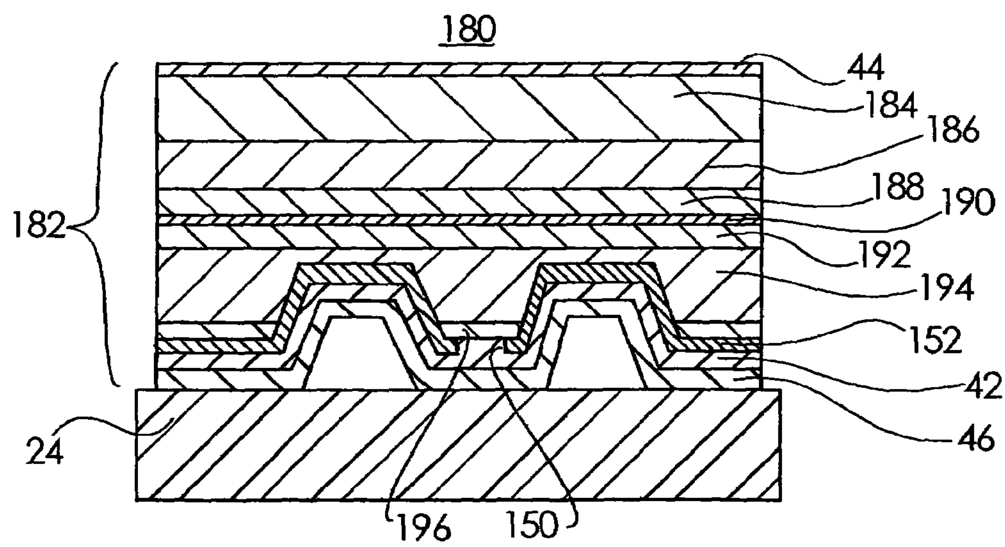
FIG. 22 is a cross-sectional view of a modification of the semiconductor laser device according to one embodiment of the present invention.

FIG. 22 is a cross-sectional view of a modification of the semiconductor laser device according to one embodiment of the present invention.

The semiconductor laser device 180 shown in FIG. 22 is a semiconductor laser device having a ridge waveguide structure whose oscillation wavelength is about 410 nm, and is formed of a semiconductor laser element 182 and a heat sink 24.

In FIG. 22, the semiconductor laser element 182 includes an n-GaN substrate 184, and an n-AlGaN cladding layer 186 (its Al composition ratio x=0.9, and its thickness t=2.0 μl) used as a second semiconductor layer, an undoped GaN guide layer 188 (its thickness t=100 nm) used as a fourth semiconductor layer, an undoped InGaN active layer 190 (its In composition ratio n=0.1, and its thickness t=10 nm), an undoped GaN guide layer 192 (its thickness t=100 nm) used as a third semiconductor layer, a p-AlGaN cladding layer 194 (its Al composition ratio x=0.4, and its thickness t=1.0 μm) used as a first semiconductor layer, and a p-GaN contact layer 196, all of which are sequentially disposed over the surface of the n-GaN substrate 184 from the n-GaN substrate 184 side.

The p-AlGaN cladding layer 194 and the p-GaN contact layer 196 form a waveguide ridge, and an insulating film 152 having an opening 150 located in the top of the waveguide ridge is formed on the surface of the p-GaN contact layer 196. A p electrode 42 is disposed on the opening 150 and the insulating film 152, and an n electrode 44 is disposed on the back side of the n-GaN substrate 184. A gold-plated layer 46 is disposed on the surface of the p electrode 42. The semiconductor laser element 182 is joined to the heat sink 24 via the gold-plated layer 46 interposed therebetween by solder.

In the semiconductor laser device 180, the refractive index of the n-AlGaN cladding layer 186 is higher than that of the p-AlGaN cladding layer 194.

Thus, effective refractive indices of the undoped GaN guide layer 188 and the n-AlGaN cladding layer 186 disposed on the side opposite to the heat sink 24 with respect to the undoped InGaN active layer 190 become higher than the effective refractive indices of the undoped GaN guide layer 192 and the p-AlGaN cladding layer 194 disposed on the heat sink 24 side with respect to the undoped InGaN active layer 190. Therefore, a light intensity distribution extends principally to the n-AlGaN cladding layer 186 disposed on the side opposite to the heat sink 24. Thus, since the angle θv of expansion of a vertical beam becomes small and the angle θh of expansion of a horizontal beam does not change in particular, an aspect ratio corresponding to the ratio of the angle θv to the angle θh becomes small.

When the angle θv of expansion of the vertical beam becomes small, the beam diameter of a near field pattern expands and an optical density is reduced. Therefore, end-face degradation at high power is lessened and hence the reliability of an LD at a high-power operation is enhanced.

As to thermal conductivity, the thermal conductivity of the p-AlGaN cladding layer 194 disposed on the heat sink 24 side becomes higher than that of the n-AlGaN cladding layer 186 disposed on the side opposite to the heat sink 24. Thus, heat generated in the vicinity of the undoped InGaN active layer 190 is easy to conduct to the heat sink 24 and hence a radiating effect is enhanced.

Further, a light intensity distribution extends principally to the n-AlGaN cladding layer 186 disposed on the side opposite to the heat sink 24 with respect to the undoped InGaN active layer 190. Therefore, the optical influence of the p-GaN contact layer 196 is not exerted even if the thickness of the p-AlGaN cladding layer 194 disposed on the heat sink 24 side with respect to the undoped InGaN active layer 190 is reduced to a thickness of 1.0 μm. On the other hand, the n-AlGaN cladding layer 186 disposed on the expansion side of the light intensity distribution is increased to a thickness of 2.0 μm to lessen the optical influence of the n-GaN substrate 184. Thus, the distance from the undoped InGaN active layer 190 to the heat sink 24 can be shortened, thereby making it possible to further enhance a radiating effect.

The semiconductor laser device according to the present embodiment as described above has an effect similar to the third embodiment under the semiconductor laser device having the ridge waveguide structure.

Incidentally, the materials, the semiconductor laser structure, and the composition ratios and thicknesses of the respective layers described in the above embodiment are not limited to the above illustrated by way of example.

Although the above embodiment has explained, as one example, the single quantum well structure having one active layer, the present invention is not limited to it. Even in an active layer of a multi-quantum well structure, a similar effect is brought about.

Although the embodiment described above has explained the broad area laser in which the current restriction structure has been made based on the proton injection, the present invention is not limited to it. An insulating film stripe laser configured in the form of a current restriction structure based on an insulating film also brings about a similar effect.

Although the ridge waveguide structure has been explained as the waveguide structure by way of example, the present invention is not limited to it but may be an embedded structure or an embedded ridge structure.

As described above, the semiconductor laser device according to the present invention is suitable for a semiconductor laser device which requires a high-power operation, such as one for solid-state laser excitation.

While the presently preferred embodiments of the present invention have been shown and described. It is to be understood these disclosures are for the purpose of illustration and that various changes and modifications may be made without departing from the scope of the invention as set forth in the appended claims.

What is claimed is:

1. A semiconductor laser device, comprising:

a radiating body having one main surface;

a first conductivity type first semiconductor layer of a first conductivity type disposed on the main surface of said radiating body, said first semiconductor layer having a first main surface opposite to the main surface of said radiating body and a second main surface opposite to the first main surface with respect to each other;

an active layer disposed on the second main surface of said first semiconductor layer, said active layer having a first main surface opposite to the second main surface of said first semiconductor layer and a second main surface opposite to the first main surface of said active layer with respect to each other; and a second conductivity type second semiconductor layer of a second conductivity type disposed on the second main surface of said active layer, said second semiconductor layer having a first main surface opposite to the second main surface of said active layer and a second main surface opposite to the first main surface of said second semiconductor layer with respect to each other, wherein an effective refractive index between the first main surface of said active layer and the first main surface of said first semiconductor layer is lower than an effective refractive index between the second main surface of said active layer and the second main surface of said second semiconductor layer, and a thermal resistance between the first main surface of said active layer and the first main surface of said first semiconductor layer is smaller than a thermal resistance between the second main surface of said active layer and the second main surface of said second semiconductor layer.

2. The semiconductor laser device according to claim 1, wherein the first semiconductor layer has a thermal conductivity of $\lambda 1$, a refractive index of n1 and a thickness of t1, the active layer has a refractive index of na, the second semiconductor layer has a thermal conductivity of $\lambda 2$, a refractive index of n2 and a thickness of t2, and wherein $na>n2>n1$ and $t2/\lambda 2>t1/\lambda 1$.

3. The semiconductor laser device according to claim 1, further comprising an undoped third semiconductor layer having a refractive index of n3, a thermal conductivity of $\lambda 3$ and a thickness of t3, which is disposed between the first semiconductor layer and the active layer and an undoped fourth semiconductor layer having a refractive index of n4, a thermal conductivity of $\lambda 4$ and a thickness of t4, which is disposed between the second semiconductor layer and the active layer, wherein $na>n3$, $na>n4$ and $t4/\lambda 4>t3/\lambda 3$.

4. The semiconductor laser device according to claim 1, wherein the first semiconductor layer and the second semiconductor layer are respectively constituted of a material in which the refractive index n1 of the first semiconductor layer or the refractive index n2 of the second semiconductor layer lies in a region in which the thermal conductivity increases with a decrease in refractive index.

5. A semiconductor laser device comprising:

a radiating body having one main surface;

a first semiconductor layer of a first conductivity type disposed on the main surface of said radiating body;

a third semiconductor layer having one or plural layers, which is disposed on said first semiconductor layer:

an active layer disposed on said third semiconductor layer;

a fourth semiconductor layer having one or plural layers, which is disposed on said active layer; and a second semiconductor layer of a second conductivity type disposed on said fourth semiconductor layer, wherein a thermal resistance determined based on said first semiconductor layer and said third semiconductor layer is smaller than a thermal resistance determined based on said fourth semiconductor layer and said second semiconductor layer, and an effective refractive index determined based on said first semiconductor layer and said third semiconductor layer is lower than an effective refractive index determined based on said fourth semiconductor layer and said second semiconductor layer.

* * * * *